(12) United States Patent
Kato et al.

(10) Patent No.: US 8,847,327 B2
(45) Date of Patent: Sep. 30, 2014

(54) LAYOUT DATA CREATION DEVICE FOR CREATING LAYOUT DATA OF PILLAR-TYPE TRANSISTOR

(71) Applicant: Elpida Memory, Inc., Tokyo (JP)

(72) Inventors: Shinji Kato, Tokyo (JP); Kazuteru Ishizuka, Tokyo (JP); Kiyotaka Endo, Tokyo (JP); Mitsuki Koda, Tokyo (JP)

(73) Assignee: PS4 Luxco S.A.R.L., Luxembourg (LU)

( * ) Notice: Subject to any disclaimer, the term of this patent is extended or adjusted under 35 U.S.C. 154(b) by 0 days.

(21) Appl. No.: 13/650,875

(22) Filed: Oct. 12, 2012

(65) Prior Publication Data
US 2013/0093027 A1  Apr. 18, 2013

(30) Foreign Application Priority Data
Oct. 13, 2011  (JP) ................. 2011-225943

(51) Int. Cl.
*H01L 29/78* (2006.01)
*H01L 29/94* (2006.01)
*H01L 27/108* (2006.01)
*H01L 21/70* (2006.01)
*H01L 21/8242* (2006.01)
*H01L 29/76* (2006.01)
*H01L 27/088* (2006.01)
*G06F 17/50* (2006.01)

(52) U.S. Cl.
CPC .......... *G06F 17/5072* (2013.01); *H01L 27/088* (2013.01)
USPC .......... 257/401; 257/302; 257/324; 257/329; 257/331; 257/448; 438/261; 438/268; 438/206; 438/270; 438/197

(58) Field of Classification Search
CPC .............. H01L 29/407; H01L 29/7813; H01L 27/10876; H01L 29/0696; H01L 29/7827; H01L 29/4238; H01L 29/66666; H01L 29/0878; H01L 29/4236; H01L 29/78642
USPC .......... 257/302, 324, 329, 331, 401, 488; 438/261, 268, 156, 206, 270, 586, 197
See application file for complete search history.

(56) References Cited

U.S. PATENT DOCUMENTS

| | | | |
|---|---|---|---|
| 6,940,129 B2 * | 9/2005 | Kim et al. | 257/347 |
| 7,595,523 B2 | 9/2009 | Parthasarathy et al. | |
| 8,058,683 B2 | 11/2011 | Yoon et al. | |
| 8,222,691 B2 | 7/2012 | Parthasarathy et al. | |
| 2007/0148814 A1 * | 6/2007 | Pellizzer et al. | 438/102 |
| 2007/0228491 A1 * | 10/2007 | Forbes | 257/401 |

(Continued)

FOREIGN PATENT DOCUMENTS

| | | |
|---|---|---|
| JP | 2008-177565 A | 7/2008 |
| JP | 2008-205483 A | 9/2008 |
| JP | 2010-80756 A | 4/2010 |

*Primary Examiner* — Shaun Campbell
*Assistant Examiner* — Thai T Vuong
(74) *Attorney, Agent, or Firm* — McGinn IP Law Group, PLLC

(57) ABSTRACT

A layout data creation device includes a transistor adjustment unit. The transistor adjustment unit divides a pillar-type transistor including a plurality of unit pillar-type transistors into the unit pillar-type transistors groups. The unit pillar-type transistors can be placed in a placement area. The number of the unit pillar-type transistors in each group is an integer. The transistor adjustment unit generates sub-pillar-type transistors that are placed in the placement area.

12 Claims, 21 Drawing Sheets

(56) References Cited

U.S. PATENT DOCUMENTS

| | | | |
|---|---|---|---|
| 2007/0232007 A1* | 10/2007 | Forbes | 438/301 |
| 2008/0048241 A1* | 2/2008 | Fujiwara et al. | 257/315 |
| 2008/0116509 A1* | 5/2008 | Harari et al. | 257/324 |
| 2008/0173936 A1 | 7/2008 | Yoon et al. | |
| 2008/0197418 A1 | 8/2008 | Parthasarathy et al. | |
| 2008/0293175 A1* | 11/2008 | Torii | 438/30 |
| 2008/0315279 A1* | 12/2008 | Forbes | 257/314 |
| 2009/0294833 A1* | 12/2009 | Kim | 257/324 |
| 2009/0315105 A1* | 12/2009 | Parthasarathy et al. | 257/331 |
| 2010/0044763 A1* | 2/2010 | Borg | 257/292 |
| 2010/0078712 A1* | 4/2010 | Ikebuchi et al. | 257/329 |
| 2010/0207195 A1* | 8/2010 | Fukuzumi et al. | 257/326 |
| 2010/0219483 A1* | 9/2010 | Masuoka et al. | 257/369 |

* cited by examiner

|  | Items | Definition | Ex1 | Ex2 | Ex3 | Ex4 | Notes |
|---|---|---|---|---|---|---|---|
| Input | Number of pillars P | The number of unit pillars in a pillar transistor | 8 | 10 | 36 | 28 | |
| Input | Height of cell row R_max | The number of pillars indicating the height of a cell row | 3 | 4 | 18 | 18 | |
| Output | Division number Lx | ROUNDUP (P/R_max, 0) | 3 | 3 | 2 | 2 | |
| Output | Pillar missing Number Lp | Lx × R_max − P | 1 | 2 | 0 | 8 | |
| Output | Height of cell after correction R | R_max − ROUNDDOWN (Lp/Lx, 0) | 3 | 4 | — | 14 | Process for the case where the pillar missing is not zero |

FIG.3

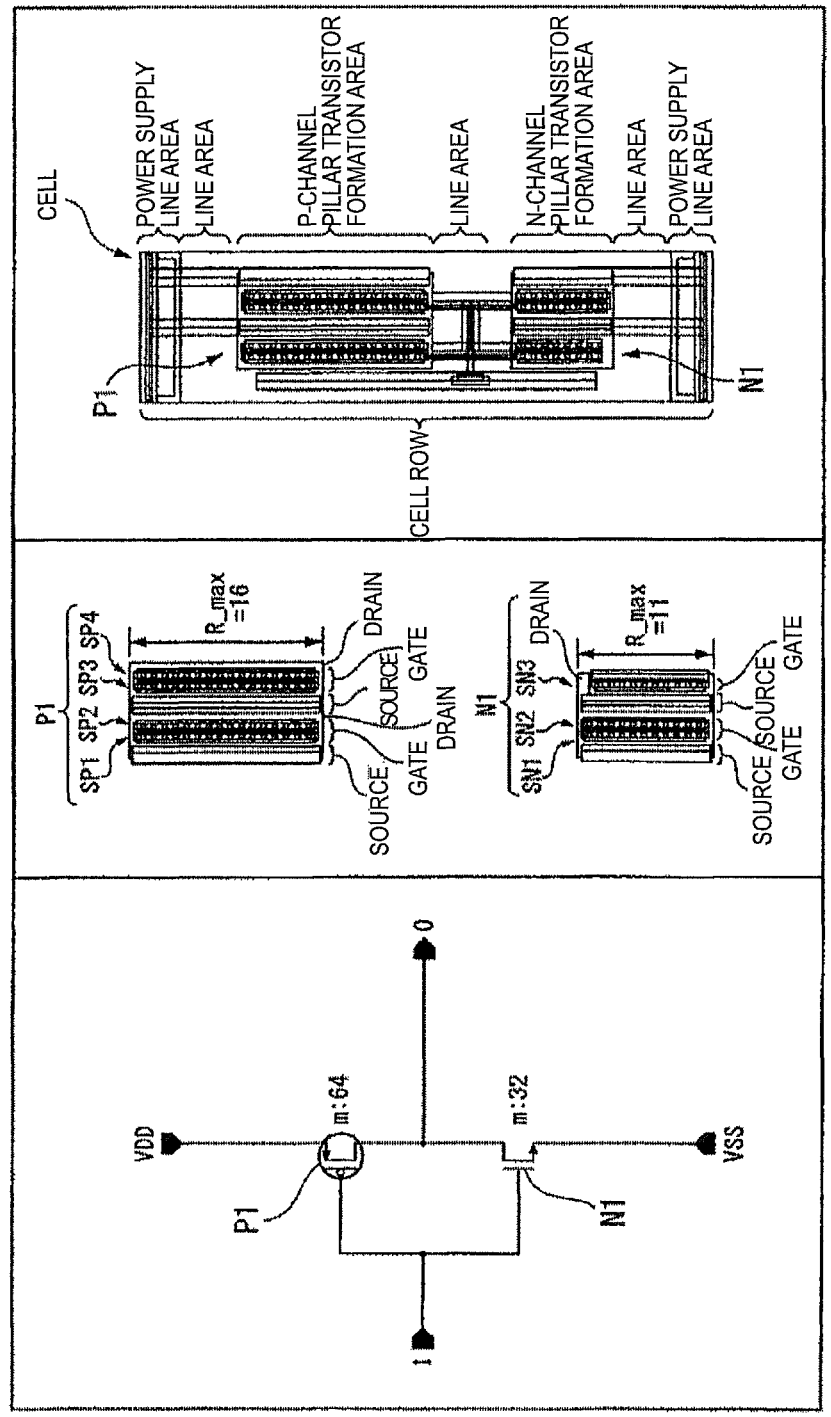

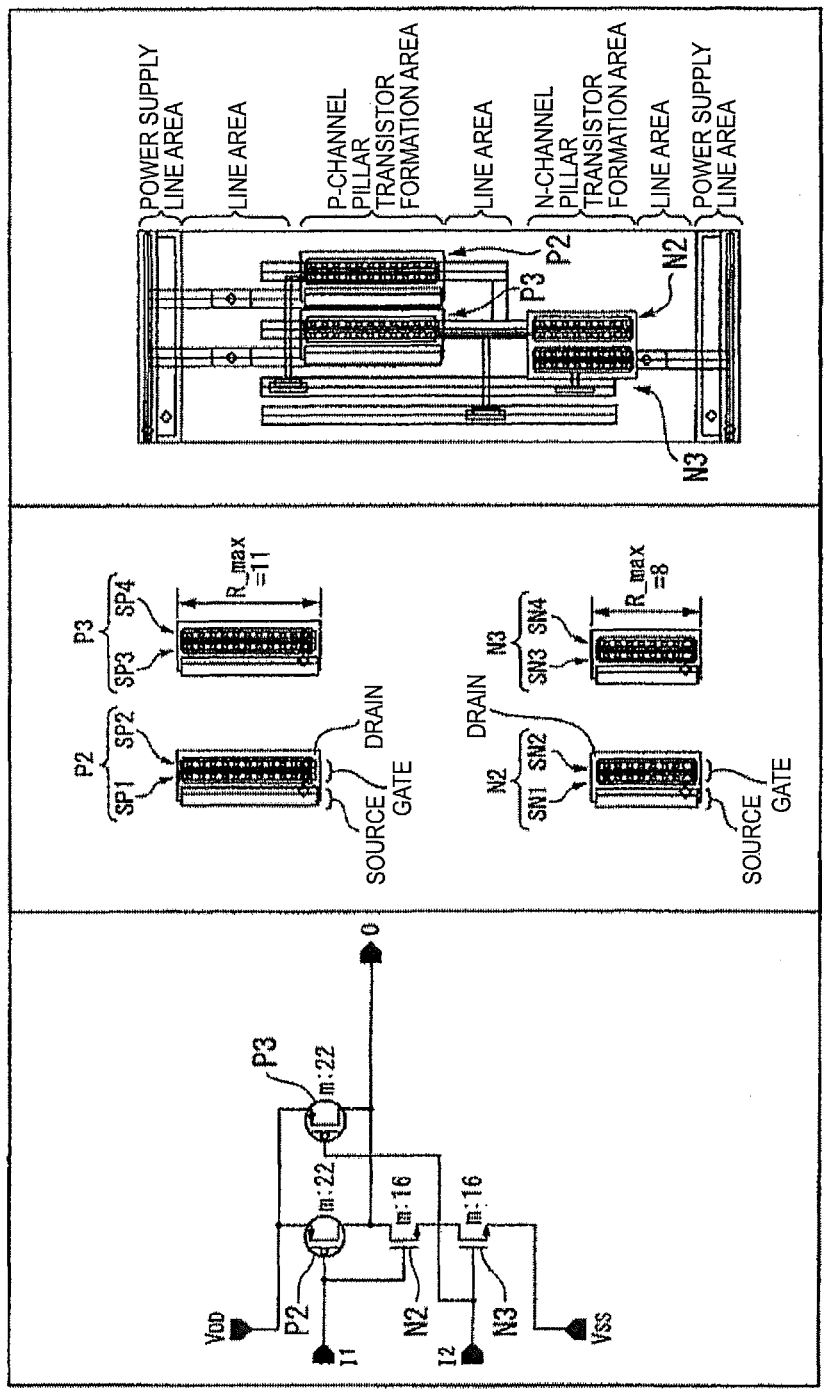

CIRCUIT DIAGRAM

GATE WIDTH
W=7

LAYOUT

A-A' CROSS-SECTION

A4-A4' CROSS-SECTION

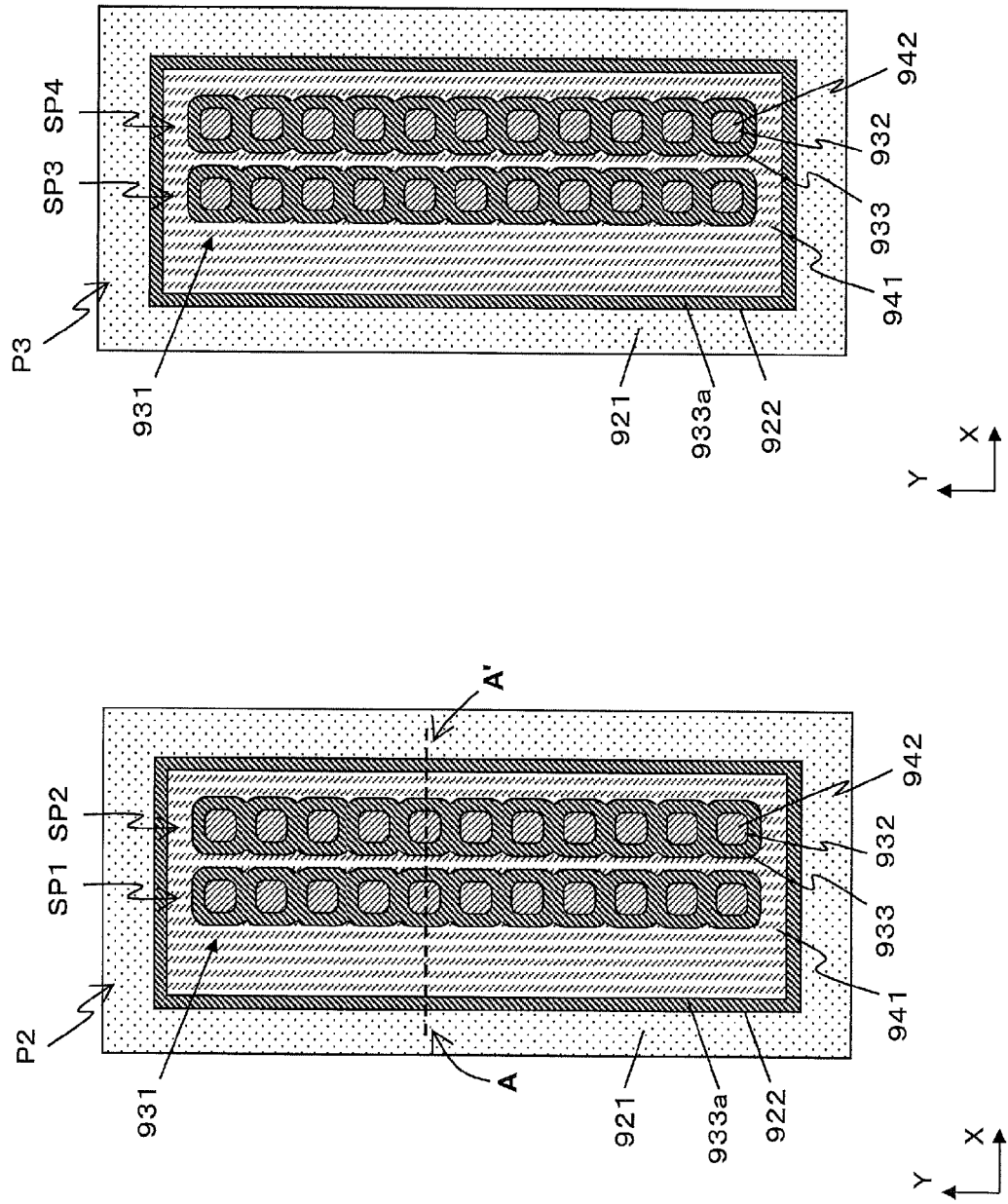

A-A' CROSS-SECTION

A-A' CROSS-SECTION

LAYOUT DATA CREATION DEVICE FOR CREATING LAYOUT DATA OF PILLAR-TYPE TRANSISTOR

BACKGROUND OF THE INVENTION

1. Field of the Invention

The present invention relates to a layout data creation device for transistor and a semiconductor device.

2. Description of Related Art

Conventionally, as a high-performance and high-density integrated circuit is developed, it is important to optimize the performance and area of transistor cells that make up the integrated circuit. In particular, the load capacity, drive capability, and area of transistors have a great impact on the performance and area of a cell that is made up of the transistors.

Improvements of integration degree of semiconductor memory devices have largely been achieved by miniaturizing transistors. However, the miniaturization of transistors seems to have approached the limit thereof. There are concerns that, even if transistors are made even smaller, the transistors would not work properly due to short-channel effects and the like.

To solve the above problem fundamentally, a method of a three-dimensional process of a semiconductor substrate to form three-dimensional transistors is proposed. A three-dimensional transistor (referred to as a pillar transistor, hereinafter) of a type that uses a silicon pillar that extends in a direction perpendicular to a main surface of a semiconductor substrate as a channel has the following advantages, among other things: the main surface of the semiconductor substrate is less occupied, and large drain current is obtained due to full depletion. Therefore, it is possible to improve the integration degree of semiconductor integrated circuits (See Japanese Patent Application Laid-Open No. 2010-80756, Japanese Patent Application Laid-Open No. 2008-205483, and Japanese Patent Application Laid-Open No. 2008-177565, for example).

Conventionally, when transistors that make up a semiconductor device are laid out, the automatic placement and routing of cells, which are made up of the transistors, is carried out by automatic layout tool. In general, during the automatic placement and routing of cells, in order to place a cell, a placement area called cell row is set up: the height and width of the placement area are constant. For example, FIGS. 7A and 7b are a diagram showing cell rows that are disposed in a peripheral circuit section around array sections that are made up of memory cells in a semiconductor memory device. As shown in FIG. 7A, while the array sections 300 are made up of memory cells, the cell rows 100 are disposed in the peripheral circuit section 200. In FIG. 7B, on the cell rows 100, cells 150, which are made up of transistors, are disposed.

FIGS. 8A and 8B are a diagram illustrating the division of a MOS (Metal Oxide Semiconductor) transistor corresponding to height H of a cell row 100 in a conventional placement and routing process. Assume that, in the following description, the channel length of the gate of the MOS transistor is constant. In this case, the division means dividing a transistor in planar view on a main surface of a semiconductor substrate.

The following takes a look at how a MOS transistor is divided when the gate width W of the MOS transistor of a cell 150 is 7 μm as shown in FIG. 8A, for example.

When the height H of a cell row 100 shown in FIGS. 7A and 7B is 4 μm, the MOS transistor is divided into two as shown in FIG. 8B so that the cell height, or the gate width W of the MOS transistors, equally becomes 3.5 p.m.

When the height H of a cell row 100 shown in FIGS. 7A and 7B is 3 μm, the MOS transistor is divided into three as shown in FIG. 8B so that the gate width W of the MOS transistors equally becomes 2.3 μm.

Meanwhile, as for a MOS transistor of a pillar type, the channel length is determined based on the depth of a pillar, and the gate width is determined based on the diameter of the pillar.

Accordingly, with respect to the height of a cell row, the number of pillar's transistors disposed is restricted. When a MOS transistor of a pillar type is divided, the division is carried out on the basis of the gate width of a unit pillar transistor; the diameter of the unit pillar transistor is changed so as not to contain fractions after the decimal point.

However, when a MOS transistor of a pillar type is used, in order to maintain the processing accuracy of a process of forming a pillar, a unit pillar transistor (one pillar-type MOS transistor) whose pillar is constant in depth and diameter is used; the unit pillar transistors, the number of which is an integer, are combined to form the MOS transistors with a desired capability. Therefore, it is not realistic to change the diameter of the pillar.

If the diameter of the pillar is changed, a process of forming a pillar for each size of diameter needs to be carried out in order to accurately fabricate the diameter of the pillar-type MOS transistor. As a result, the manufacturing processes need to be changed significantly.

SUMMARY

In one embodiment, there is provided a layout data creation device that includes a transistor adjustment unit. The transistor adjustment unit divides a pillar-type transistor into a plurality of sub-pillar-type transistors each of which includes one or more unit pillar-type transistors having the same configuration as one another. The transistor adjustment unit arranges the sub-pillar-type transistors in a predetermined area defined in an integrated circuit.

In another embodiment, there is provided a semiconductor device that includes a pillar-type transistor including a plurality of sub-pillar-type transistors arranged in a predetermined area. Each of the sub-pillar-type transistors includes one or more unit pillar-type transistors arranged in line to a first direction in the predetermined area. Each of the sub-pillar-type transistors has a source, a drain and a gate, the sources of the sub-pillar-type transistors being connected in common, the drains of the sub-pillar-type transistors being connected in common, and the gates of the sub-pillar-type transistors being connected in common.

In another embodiment, there is provided a method of designing a pillar-type transistor including a plurality of unit pillar-type transistors connected to parallel, the method including: obtaining a first number of the unit pillar-type transistors constituting the pillar-type transistor; obtaining a second number of the unit pillar-type transistors that can be arranged in a first direction of a predetermined layout area; obtaining a third number by dividing the first number by the second number with rounding up; obtaining a fourth number by multiplying the second number by the third number; obtaining a fifth number by subtracting the first number from the fourth number; obtaining a sixth number by dividing the fifth number by the third number; decreasing the second number if the sixth number is equal to or more than 1; and arranging the unit pillar-type transistors in the predetermined layout area based on the second and third number.

According to the present invention, unlike the conventional cases, the number of pillar division units does not become a number with a decimal point. Moreover, there is no need to change the diameter of the pillars of the unit pillar transistors. Furthermore, without making a process of manufacturing the semiconductor device complex, it is possible to dispose cells into a cell row in an efficient manner by using transistors of a pillar type.

BRIEF DESCRIPTION OF THE DRAWINGS

FIG. 3 is a table showing the results of the above-described processes of Examples;

FIGS. 4A to 4C are the results of dividing pillar transistors of an inverter;

FIGS. 5A to 5C are the results of pillar-transistor division of a NAND circuit;

FIGS. 11A to 11E are schematic diagram of the pillar transistor shown in FIG. 5B.

DETAILED DESCRIPTION OF THE EMBODIMENTS

Figure 1:
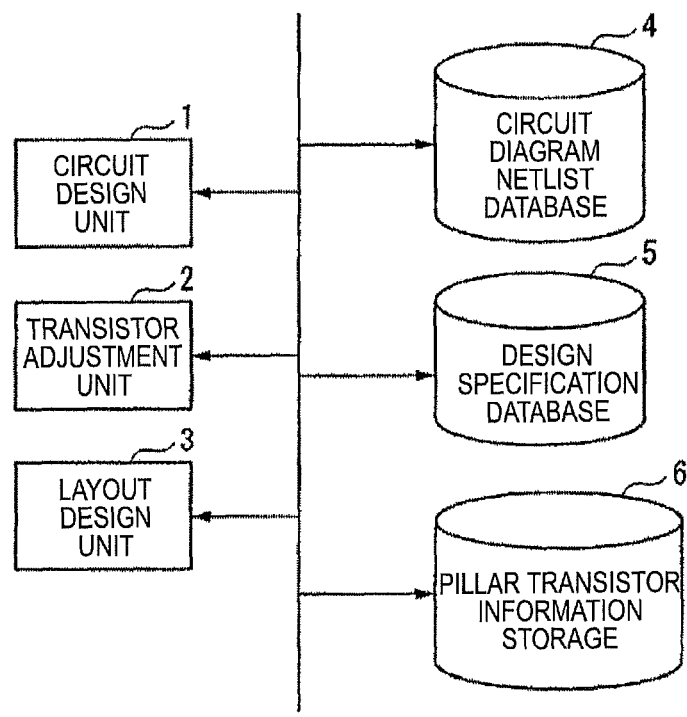
FIG. 1 is a schematic block diagram showing an example of the configuration of a layout data creation device according to one embodiment of the present invention.

Hereinafter, with reference to the accompanying drawings, an embodiment of the present invention will be described. FIG. 1 is a schematic block diagram showing an example of the configuration of a layout data creation device according to one embodiment of the present invention.

As shown in FIG. 1, the layout data creation device of the present embodiment includes a circuit design unit 1, a transistor adjustment unit 2, a layout design unit 3, a circuit diagram netlist database 4, a design specification database 5, and a pillar transistor information storage unit 6.

The circuit design unit 1 checks a system level description, which is written in accordance with the specifications of a circuit, using a C/C++ simulator and a high-level synthesis tool; expands into an HDL (Hardware description language) description; and carries out simulations of the expanded HDL description.

The circuit design unit 1 also generates a netlist, which shows connections among transistors, from a HDL circuit diagram; adds identification of the circuit diagram; attaches the identification; and writes the circuit's netlist into the circuit diagram netlist database 4. In this case, the netlist is made up of transistor data, which include connection information of transistors in a circuit, the type of each unit pillar transistor (p-channel type or n-channel type), and the number of pillars.

In the case of a pillar-type transistor (vertical transistor), in the netlist, the size of a transistor is not recorded and set as the size of gate width; the size of a transistor is recorded and set as the number of unit pillar-type transistors to be disposed on a plane of a semiconductor substrate.

In the design specification database 5, data, including the following, are stored in advance: the area of a pillar-type MOS transistor (referred to as a pillar transistor, hereinafter), the height R_max of a cell row, and rules for layout pattern and the like. In this case, the height R_max of a cell row is set as the number of unit pillar transistors that can be disposed in the direction of the height of the cell row (or in the vertical direction in the diagram) in planar view. In this case, the height R_max of a cell row is set as a value indicating the maximum number of unit pillar transistors that are disposed in the vertical direction at a time when the unit pillar transistors are disposed in the cell row.

The transistor adjustment unit 2 reads data about transistors from the circuit diagram netlist database 4. The transistor adjustment unit 2 also reads the height R_max from the design specification database 5.

Moreover, the transistor adjustment unit 2 calculates, on the basis of the transistor data and the cell row height R_max, the number of unit pillar transistors obtained by dividing a pillar transistor that is laid out on a plane of a semiconductor substrate, and the height R of a cell after the division.

The transistor adjustment unit 2 checks whether or not the number P of unit pillar transistors of a pillar transistor (a pillar transistor is made up of a plurality of unit pillar transistors) that makes up a cell exceeds the height R_max of a cell row. When the number P of unit pillar transistors exceeds the height R_max, the unit pillar transistors of the pillar transistor are divided into a plurality of groups, or sub-pillar transistors. When the number P of unit pillar transistors is less than or equal to the height R_max, the pillar transistor is not divided.

In the pillar transistor information storage unit 6, along with the identification of a pillar transistor that makes up a cell in the netlist, the following are stored: the height R of a cell in which pillar transistors or sub-pillar transistors are disposed; the division number of a pillar transistor (or the number of groups into which the unit pillar transistors are divided); and the number of unit pillar transistors per sub-pillar transistor.

After a pillar-transistor division process is completed, for example, the transistor adjustment unit 2 writes, along with the identification of the pillar transistor, the pillar-transistor division information into the design specification database 5 in the following data format so that the information is stored in the design specification database 5 if the number P of unit pillar transistors is eight, the division-number cell height R is four, and the division number Lx is two: Tr=(R:4, Lx:2, #1(4), #2(4)).

In this case, "#1(4)" means that, in two sub-pillar transistors obtained after a pillar transistor is divided, the first sub-pillar transistor is made up of four unit pillar transistors; "#2(4)" means that, the second sub-pillar transistor is made up of four unit pillar transistors.

The layout design unit 3 reads a netlist of a circuit from the circuit diagram netlist database 4; automatically places a created cell on a cell row; and wires terminals of transistors on the basis of the netlist.

Figure 2:
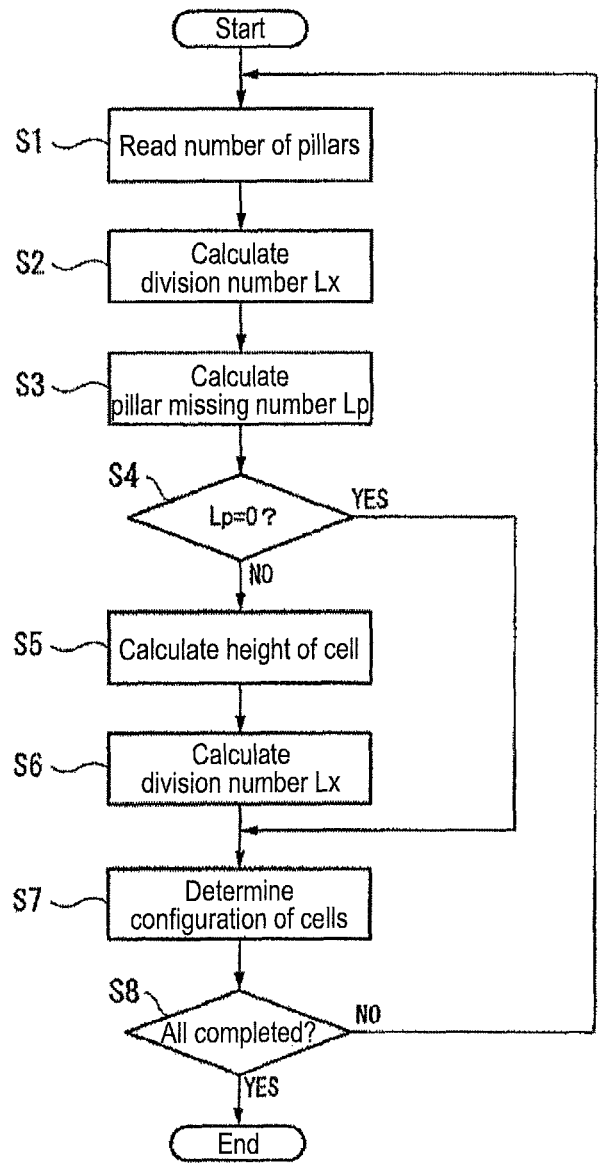
FIG. 2 is a flowchart showing an example of the pillar-transistor division process that uses the transistor adjustment unit.

The following describes a flow of a pillar-transistor division process that uses the layout data creation device of the present embodiment, with reference to FIG. 2. FIG. 2 is a flowchart showing an example of the pillar-transistor division process that uses the transistor adjustment unit 2.

Step S1:

The transistor adjustment unit 2 sequentially reads transistor data from the circuit diagram netlist database 4.

The transistor adjustment unit 2 also reads the height R_max of a cell row from the design specification database 5. Then, the process proceeds to step S2.

Step S2:

Then, the transistor adjustment unit 2 uses the following equation (1) to calculate the division number Lx, which indicates how many sub-pillar transistors are obtained by dividing a pillar transistor, with the use of the transistor data that the transistor adjustment unit 2 has read.

That is, the transistor adjustment unit 2 divides the number P of unit pillar transistors from the transistor data by the height R_max of the cell row, and outputs the division number Lx as an integer number before the process proceeds to step S3.

$$Lx = \text{ROUNDUP}(P/R\_max, 0) \quad (1)$$

In this case, what is used is "ROUNDUP(formula, 0)", a function for rounding the result of calculation by the formula up to the closest whole number.

Step S3:

The transistor adjustment unit 2 uses the following equation (2) to calculate a pillar missing number Lp at a time when the unit pillar transistors in the pillar transistor are divided by the division number Lx. Then, the process proceeds to step S4.

$$Lp = Lx \times R\_max - P \quad (2)$$

In this case, the pillar missing number Lp indicates the difference between the number of unit pillar transistors in an area actually occupied by a cell which is obtained by multiplying the division number Lx by the height R_max of the cell row (or the number of unit pillar transistors that can be disposed), and the number P of unit pillar transistors of the actual pillar transistor. That is, the pillar missing number Lp indicates the number of unit pillar transistors uselessly occupied by a cell as a cell's placement area even as no unit pillar transistors are disposed according to the current arrangement.

Step S4:

Then, the transistor adjustment unit 2 checks whether or not the pillar missing number Lp is zero. If the pillar missing number Lp is zero (i.e. Lp=0), the height R of a transistor cell is recognized as the height R_max of the cell row; then the process proceeds to step S7.

If the pillar missing number Lp is not zero (i.e. Lp≠0), the transistor adjustment unit 2 allows the process to proceed to step S5 in order to calculate the height of a cell row.

Step S5:

Then, the transistor adjustment unit 2 uses the following equation (3) to calculate the height R of a transistor cell from the height R of the cell row before the process proceeds to step S6.

$$R = R\_max - \text{ROUNDDOWN}(Lp/Lx, 0) \quad (3)$$

In this case, what is used is "ROUNDDOWN(formula, 0)", a function for rounding the result of calculation by the formula down to the closest whole number. The process based on the equation (3) is a process of calculating the number of pillars at a time when the pillar missing number Lp is spread across the sub-pillar transistors by multiplying the number of unit pillar transistors that can be disposed in an area where no unit pillar transistor is disposed in a row of sub-pillar transistors where the pillar missing number occurs, i.e. the pillar missing number Lp, by the division number Lx.

Step S6:

Then, the transistor adjustment unit 2 substitutes the newly calculated height R of the cell into R_max of the equation (1), and therefore calculates the division number Lx that is to be used after the change in the height of the cell.

The transistor adjustment unit 2 also uses the equation (2) to calculate the pillar missing number Lp; subtracts the pillar missing number Lp from the height R; and uses the resultant value as the number of unit pillar transistors of one of the sub-pillar transistors that are obtained by division.

The transistor adjustment unit 2 proceeds to step S7.

Step S7:

Then, the transistor adjustment unit 2 determines the arrangement and configuration of sub-pillar transistors in a cell on the basis of the already-calculated cell height R, division number Lx, and pillar missing number Lp; associates the arrangement and configuration of the sub-pillar transistors in the cell with the identification of a pillar transistor; writes the resulting information into the pillar transistor information storage unit 6 so that the information is stored therein; and allows the process to proceed to step S8.

For example, when the number P of pillars is eight, the division-number cell height R four, and the division number Lx two, the transistor adjustment unit 2 writes, along with the identification of the pillar transistor, the division information that is generated at a time when the pillar transistor is divided into a plurality of sub-pillar transistors into the transistor adjustment unit 2 so that the information is stored therein: the division information is represented as Tr=(R:4, Lx:2, #1(4), #2(4)).

Step S8:

Then, from the circuit diagram netlist database 4, the transistor adjustment unit 2 detects whether or not transistor data of a pillar transistor in a cell that has not been processed exist.

At this time, if a pillar transistor of a cell that has not been processed is detected in the circuit diagram netlist database 4, the transistor adjustment unit 2 proceeds to step S1.

If a pillar transistor of a cell that has not been processed is not detected in the circuit diagram netlist database 4, the transistor adjustment unit 2 brings the process to an end.

Using examples of actual processing, the following describes how to generate the arrangement and configuration of cells by dividing a pillar transistor, which complies with the flowchart of FIG. 2, into sub-pixels.

Example

No. 1

The number P of unit pillar transistors of a pillar transistor is eight; the height R_max of a cell row is three. In this case, at step S2, the transistor adjustment unit 2 calculates Lx=3 using the equation (1).

At step S3, the transistor adjustment unit 2 uses the equation (2) to calculate the pillar missing number Lp: Lp=1. At this time, since the pillar missing number Lp is not zero, the transistor adjustment unit 2 at step S4 proceeds to step S5. Then, the transistor adjustment unit 2 at step S5 uses the equation (3) to calculate the cell height R: R=3.

Then, the transistor adjustment unit 2 at step S6 uses the equation (1) to calculate the division number Lx, which is the number of sub-pillar transistors obtained by dividing a pillar transistor: Lx=3.

Moreover, the transistor adjustment unit 2 at step S6 uses the equation (2) to calculate the pillar missing number Lp of the pillar transistor: Lp=1. The transistor adjustment unit 2 then subtracts the pillar missing number, Lp=1, from the cell height, R=3. As a result, the number of unit pillar transistors of the third sub-pillar transistor is two.

Then, the transistor adjustment unit 2 performs the above-described process to write the division information of the pillar transistor, Tr=(R:3, Lx:3, #1(3), #2(3), #3(2)), into the pillar transistor information storage unit 6 along with the identification of the pillar transistor.

Example

No. 2

The number P of pillars of a pillar transistor is ten; the height R_max of a cell row is four. In this case, at step S2, the transistor adjustment unit 2 calculates Lx=3 using the equation (1).

At step S3, the transistor adjustment unit 2 uses the equation (2) to calculate the pillar missing number Lp: Lp=2. At this time, since the pillar missing number Lp is not zero, the transistor adjustment unit 2 at step S4 proceeds to step S5. Then, the transistor adjustment unit 2 at step S5 uses the equation (3) to calculate the cell height R: R=4.

Then, the transistor adjustment unit 2 at step S6 uses the equation (1) to calculate the division number Lx, which is the number of sub-pillar transistors obtained by dividing a pillar transistor: Lx=3.

Moreover, the transistor adjustment unit 2 at step S6 uses the equation (2) to calculate the pillar missing number Lp of the pillar transistor: Lp=2. The transistor adjustment unit 2 then subtracts the pillar missing number, Lp=2, from the cell height, R=4. As a result, the number of unit pillar transistors of the third sub-pillar transistor (#3) is two.

Then, the transistor adjustment unit 2 performs the above-described process to write the division information of the pillar transistor, Tr=(R:4, Lx:3, #1(4), #2(4), #3(2)), into the pillar transistor information storage unit 6 along with the identification of the pillar transistor.

Example

No. 3

The number P of pillars of a pillar transistor is 36; the height R_max of a cell row is 18. In this case, at step S2, the transistor adjustment unit 2 uses the equation (1) to calculate the division number Lx, which is the number of sub-pillar transistors obtained by dividing a pillar transistor: Lx=2.

At step S3, the transistor adjustment unit 2 uses the equation (2) to calculate the pillar missing number Lp: Lp=0. At this time, since the pillar missing number Lp is zero, the transistor adjustment unit 2 at step S4 proceeds to step S7.

Then, the transistor adjustment unit 2 performs the above-described process to write the division information of the pillar transistor, Tr=(R:18, Lx:2, #1(18), #2(18)), into the pillar transistor information storage unit 6 along with the identification of the pillar transistor.

Example

No. 4

The number P of pillars of a pillar transistor is 28; the height R_max of a cell row is 18. In this case, at step S2, the transistor adjustment unit 2 uses the equation (1) to calculate the division number Lx: Lx=2.

At step S3, the transistor adjustment unit 2 uses the equation (2) to calculate the pillar missing number Lp: Lp=8. At this time, since the pillar missing number Lp is not zero, the transistor adjustment unit 2 at step S4 proceeds to step S5. Then, the transistor adjustment unit 2 at step S5 uses the equation (3) to calculate the cell height R: R=14.

Then, the transistor adjustment unit 2 at step S6 uses the equation (1) to calculate the division number Lx, which is the number of sub-pillar transistors obtained by dividing a pillar transistor: Lx=2.

Moreover, the transistor adjustment unit 2 at step S6 uses the equation (2) to calculate the pillar missing number Lp of the pillar transistor: Lp=0. The transistor adjustment unit 2 then subtracts the pillar missing number, Lp=0, from the cell height, R=14. As a result, the number of unit pillar transistors of the second sub-pillar transistor is 14.

Then, the transistor adjustment unit 2 performs the above-described process to write the division information of the pillar transistor, Tr=(R:14, Lx:2, #1(14), #2(14)), into the pillar transistor information storage unit 6 along with the identification of the pillar transistor.

FIG. 3 is a table showing the results of the above-described processes of Examples No. 1 to No. 4. The parameters that the transistor adjustment unit 2 reads and inputs are as follows: the number P of unit pillar transistors of a to-be-processed pillar transistor, and the height R_max of a cell row. As outputs, the following are shown: the division number Lx, the pillar missing number Lp, and the post-correction cell height R.

In the case of Example No. 3, the pillar missing number Lp is zero. Therefore, the cell height R is not newly calculated by the equation (3); the cell row height R_max is just used as R.

In Examples No. 1 and No. 2, even though the pillar missing number Lp exists, the cell height R, if calculated, is equal to the cell row height R_max. Therefore, the transistor adjustment unit 2 generates the division information Tr of the pillar transistor with the pillar missing number Lp remaining unchanged, even though the pillar missing number Lp is not zero.

In the case of Example No. 4, from the cell row height R_max, the cell height R is calculated by the equation (3). Because of the cell height R, the pillar missing number Lp turns out to be zero.

FIGS. 4A to 4C are a diagram showing a layout of an inverter (NOT circuit) that uses pillar transistors, which is created by the layout data creation device of the present embodiment. FIG. 4B shows the results of dividing pillar transistors of an inverter, which are made up of a p-channel transistor P1 and a n-channel transistor N1 in a netlist shown in FIG. 4A.

In this case, in the inverter shown in FIG. 4A, the number P of unit pillar transistors of the p-channel pillar transistor P1 is 64; the cell row height R_max is 16. Moreover, in the inverter shown in FIG. 4A, the number P of unit pillar transistors of the n-channel pillar transistor N1 is 32; the cell row height R_max is 11.

In the process of the flowchart shown in FIG. 3, as shown in FIG. 4B, the transistor adjustment unit 2 sets the division information of the p-channel pillar transistor P1 in the following manner: Tr=(R:16, Lx:4, #1(16), #2 (16), #3 (16), #4(16)).

Similarly, as shown in FIG. 4B, in the process of the flowchart shown in FIG. 3, the transistor adjustment unit 2 sets the division information of the n-channel pillar transistor N1 in the following manner: Tr=(R:11, Lx:3, #1(11), #2(11), #3(10)).

Between the sub-pillar transistors SP1(#1), SP2(#2), SP3 (#3), and SP4(#4), which are obtained by dividing the pillar transistor P1, the number of unit pillar transistors in the sub-pillar transistor is equal. Meanwhile, between the sub-pillar transistors SN1(#1) and SN2(#2), which are obtained by dividing the pillar transistor N1, the number of unit pillar transistors in the sub-pillar transistor is equal. However, the number of unit pillar transistors in the sub-pillar transistor SN3(#3) is different from the numbers for the other sub-pillar transistors SN1(#1) and SN2(#2).

FIG. 4C shows the arrangement of the pillar transistors P1 and N1 in a cell row.

The cell row includes a p-channel pillar transistor formation area (or a transistor formation area inside a well region where n-type impurity is diffused), in which a p-channel pillar transistor is formed; a n-channel pillar transistor formation area (or a transistor formation area inside a well region where p-type impurity is diffused); a power supply line area; and a line area for transistors in the cell.

As indicated by the above-described division information, as for the p-channel pillar transistor P1, the pillar missing number is zero. Therefore, the transistors each are disposed in the pillar transistor area without changing the height of the cell.

As for the n-channel pillar transistor N1, the pillar missing number P is one. However, the result of ROUNDDOUN(Lp/Lx, 0) is zero, i.e. Lp<Lx is zero. Therefore, the cell height R is equal to the cell row height R_max.

As shown in FIG. 4C, the sources, drains, and gates of the sub-pillar transistors SP1(#1), SP2(#2), SP3(#3), and SP4 (#4) are connected in common.

As described above, the cell row height R_max that represents the maximum number of pillars that can be disposed in the vertical direction when the p-channel pillar transistor is disposed is set as the height of the p-channel pillar transistor formation area. Similarly, the cell row height R_max that represents the maximum number of unit pillar transistors that can be disposed in the vertical direction when the n-channel pillar transistor is disposed is set as the height of the n-channel pillar transistor formation area.

The following explains an example of a specific device structure of the inverter (NOT circuit) shown in FIGS. 4A to 4C.

FIGS. 9A to 9D are diagrams showing a device structure of the pillar transistor P1 and the pillar transistor N1 shown in FIG. 4B. The diagram shows the stage at which the transistors have been formed.

Figure 9A:
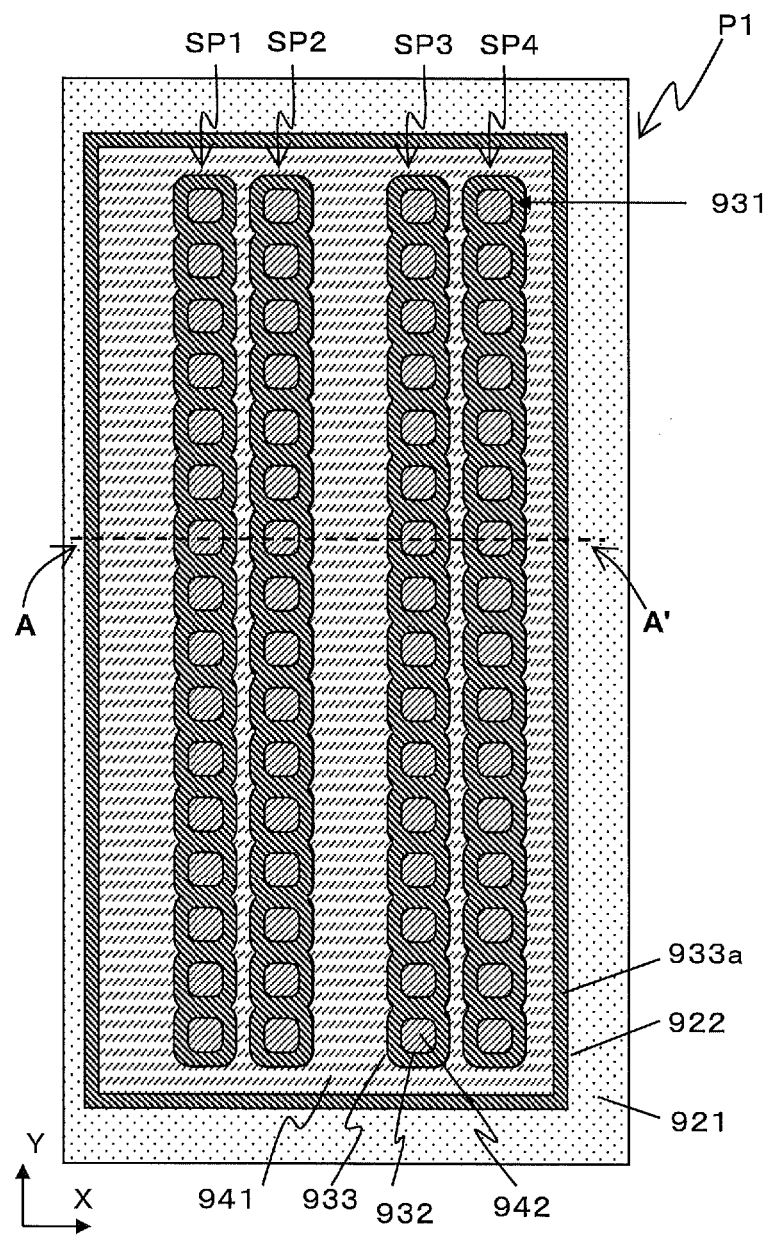
FIGS. 9A to 9D are schematic diagram of the pillar transistor shown in FIG. 4B.
Figure 9B:
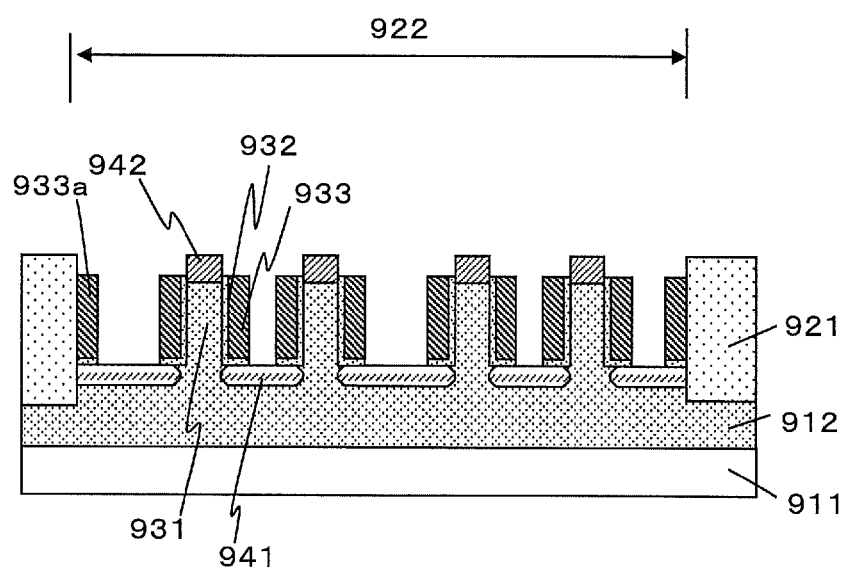

FIG. 9A is a top view of the pillar transistor P1 shown in FIG. 4B. FIG. 9B is a cross-sectional view of FIG. 9A taken along line A-A.

Figure 9C:
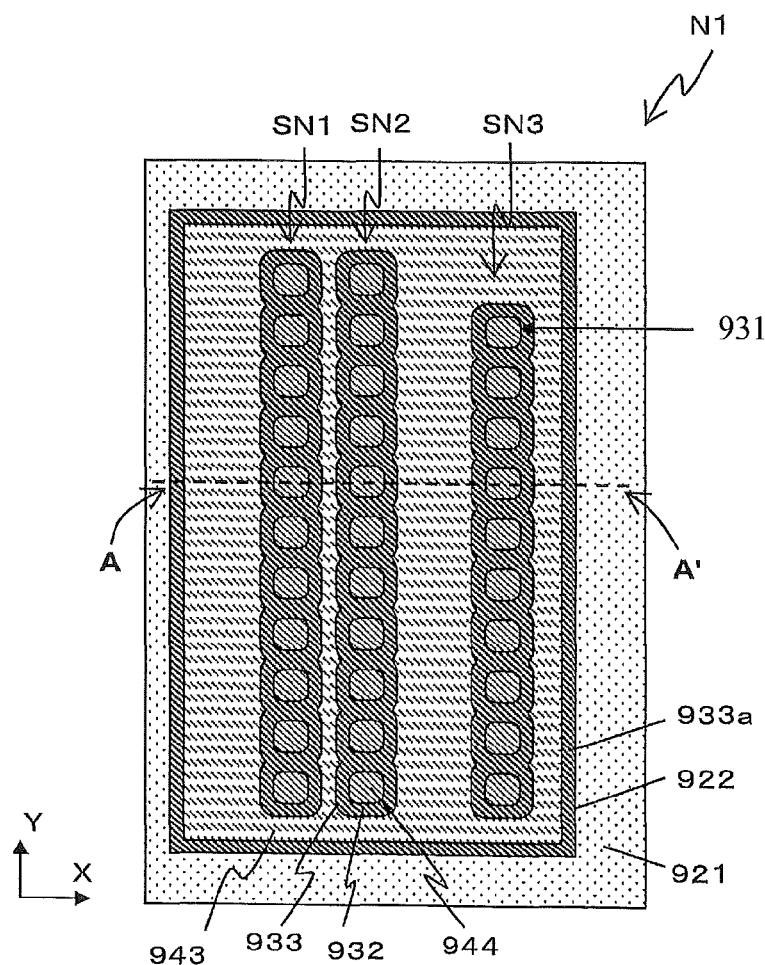
Figure 9D:
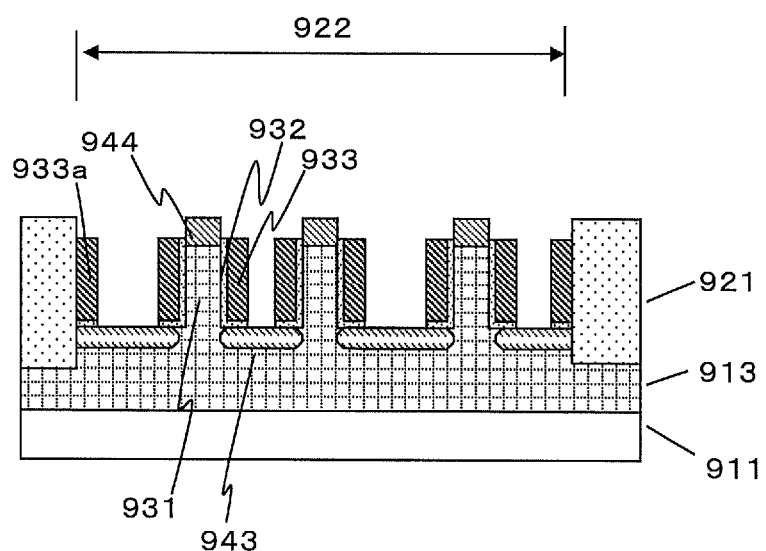

FIG. 9C is a top view of the pillar transistor N1 shown in FIG. 4B. FIG. 9D is a cross-sectional view of FIG. 9C taken along line A-A.

On the plane, the extending direction of sub-pillar transistors that makes up a pillar transistor is referred to as Y-direction; the direction perpendicular to the Y-direction is referred to as X-direction.

First, the P-channel pillar transistor P1 shown in FIGS. 9A and 9B will be described.

In a surface area of a semiconductor substrate 911, a N-type N-well 912 is formed.

In a surface portion of the semiconductor substrate 911, an element isolation insulation film 921 is formed. When seen on the plane, the periphery thereof is surrounded by the element isolation insulation film 921. As a result, an element formation area 922 is defined. For ease of explanation, as for the definition of an area of a pillar transistor, the element formation area 922 is used for the definition.

Pillars 931, which are made of a semiconductor material, are so formed as to project in a direction perpendicular to the substrate from the semiconductor substrate 911 of the element formation area 922. Incidentally, the shape of the pillars is not limited to that shown in the diagram, and may be formed into a circular shape or the like. Bodies of the pillars 931, which make up the pillar transistor P1, are doped with N-type impurities.

As for a method of forming the pillars 931, various methods, including the following, are available: a method of forming an element isolation insulation film 921 on a surface portion of a semiconductor substrate 911 using STI method and the like; forming an element formation area 922, which is defined by the element isolation insulation film 921; forming a mask in a pillar formation portion on the surface of the semiconductor substrate 911 in the element formation area 922; and using the mask to carry out the etching and cutting of the semiconductor substrate 911, thereby forming pillars 931 under the mask.

On the side surfaces of the pillars 931, as well as on the side surfaces of the element isolation insulation film 921, gate electrodes 933 are formed, with gate insulation films 932 disposed therebetween. As for a method of forming the gate electrodes 933, various methods, including the following, are available: a method of forming a gate insulation film 932 on the surfaces of the semiconductor substrate 911 and the pillars 931; forming a conducting film, which will function as gate electrodes; and carrying out the etching back of the conducting film, thereby forming gate electrodes 933 of a sidewall type on the side walls of the pillars 931. At this time, on the side walls of the element isolation insulation film 921, gate electrode blocks 933a are formed.

On the semiconductor substrate 911 on the lower sides of the pillars 931, and in upper areas of the pillars 931, source/drain regions are formed. For ease of explanation, among the two types of region, i.e. source and drain, the regions formed on the semiconductor substrate 911 are referred to as source, and the regions formed in the upper areas of the pillars 931 are referred to as drain. In the P-channel pillar transistor P1, the sources 941 and the drains 942 are made from P-type diffusion layers.

Therefore, the pillars 931 serve as bodies; the drains 942 and the sources 941 are formed on the upper and lower sides of the pillars 931; and the gate electrodes 933 are formed on the side walls. In this manner, pillar transistors are formed.

On the plane, a plurality of pillars 931 are so formed as to be arranged side by side in the Y-direction, forming sub-pillar transistors. In the example shown in FIG. 9A, 16 pillars 931 arranged in the Y-direction make up a P-channel sub-pillar transistor SP. The gate electrodes 933 are so formed as to encircle the pillars 931. The gate electrodes 933 are so formed as to be connected together between the pillars 931 that are adjacent to each other in the Y-direction. As a result, a series of gate electrodes that are connected in the Y-direction is formed as if a line is disposed. In this manner, the gate electrodes 933 are so formed as to be connected together between the pillars 931 that are adjacent to each other in the Y-direction. Therefore, the conducting film of the gate electrodes 933 is adjusted and formed so as to have a film thickness that enables the spaces between the pillars 933 adjacent to each other in the Y-direction to be filled up.

Four lines of the sub-pillar transistors SP are formed in the X-direction when seen on the plane. From left to right, the sub-pillar transistors SP are referred to as SP1, SP2, SP3, and SP4, respectively. When seen on the plane, an area on the left side of SP1 and an area between SP2 and SP3 are the areas where contacts are disposed on the sources 941. The areas are secured so that the gate electrodes 933 and the contacts are not short-circuited.

The following describes the N-channel pillar transistor N1 shown in FIGS. 9C and 9D. The N-channel pillar transistor N1 has the same cross-sectional and planar structures as the pillar transistor P1.

As for the well, a P-type P-well 913 is formed. Bodies of pillars 931 are doped with P-type impurities. Sources 943 and drains 944 are made from N-type diffusion layers.

When seen on the plane, in the pillar transistor N1, a plurality of pillars 931 are formed and arranged in the Y-direction, forming N-channel sub-pillar transistors SN. Three lines of sub-pillar transistors SN are formed in the X-direction. From left to right, the sub-pillar transistors SN are referred to as SN1, SN2, and SN3, respectively. SN1 and SN2 each are made up of 11 pillars 931 in the Y-direction. SN3 is made up of ten pillars 931. When seen on the plane, an area on the left side of SN1 and an area between SN2 and SN3 are the areas where contacts are disposed on the sources 943. The areas are secured so that the gate electrodes 933 and the contacts are not short-circuited.

FIGS. 10A to 10D are diagrams showing the device structure of the cell shown in FIG. 4C. FIGS. 10A to 10D show the structure in which interlayer films, contacts, and lines have been formed after the pillar transistors shown in FIGS. 9A to 9D are formed.

Figure 10A:
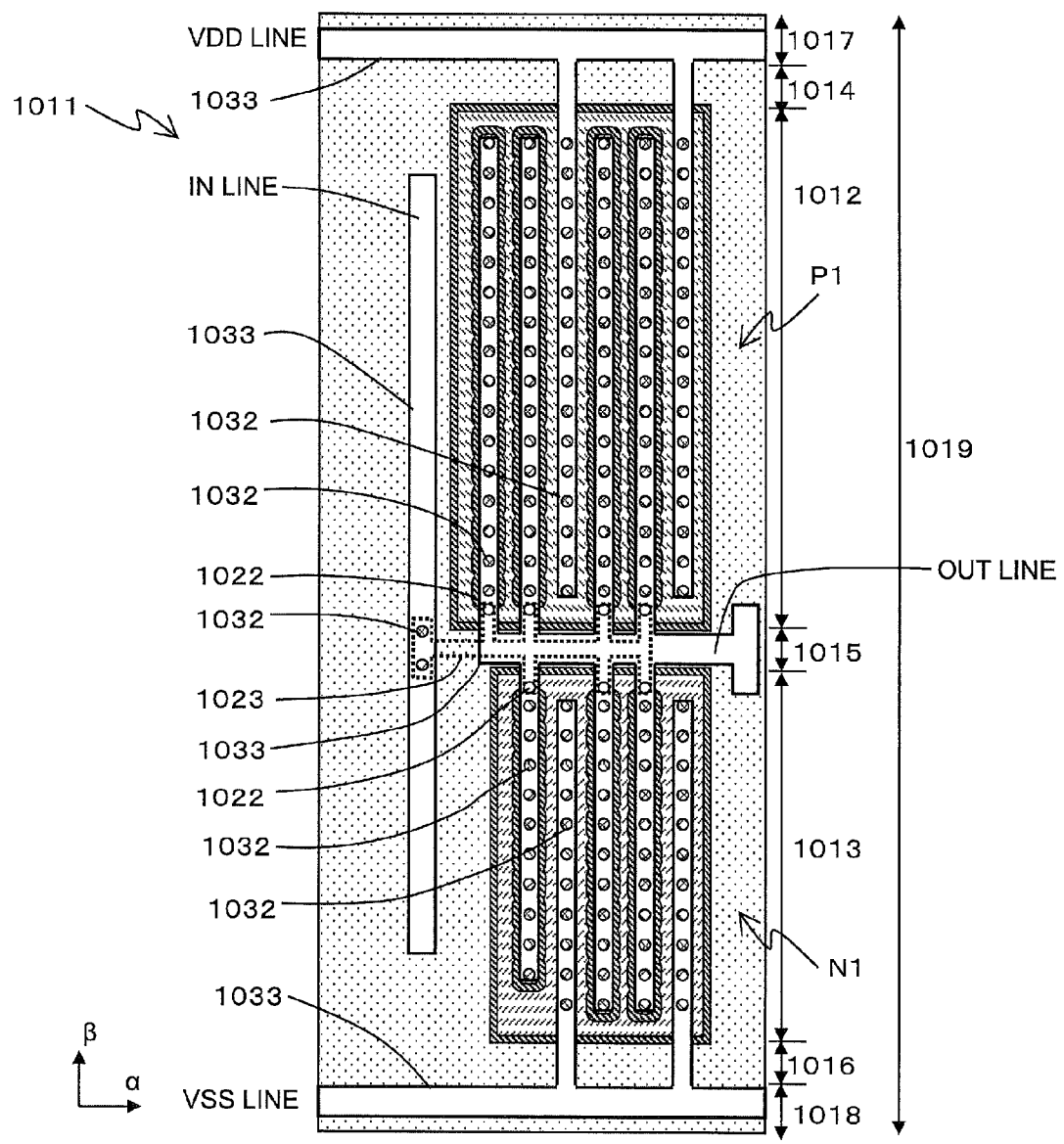
FIGS. 10A to 10D are schematic diagram showing a first contact, a first line, a second contact, and a second line, along with the pattern of pillar transistors shown in FIGS. 9A to 9D.
Figure 10B:
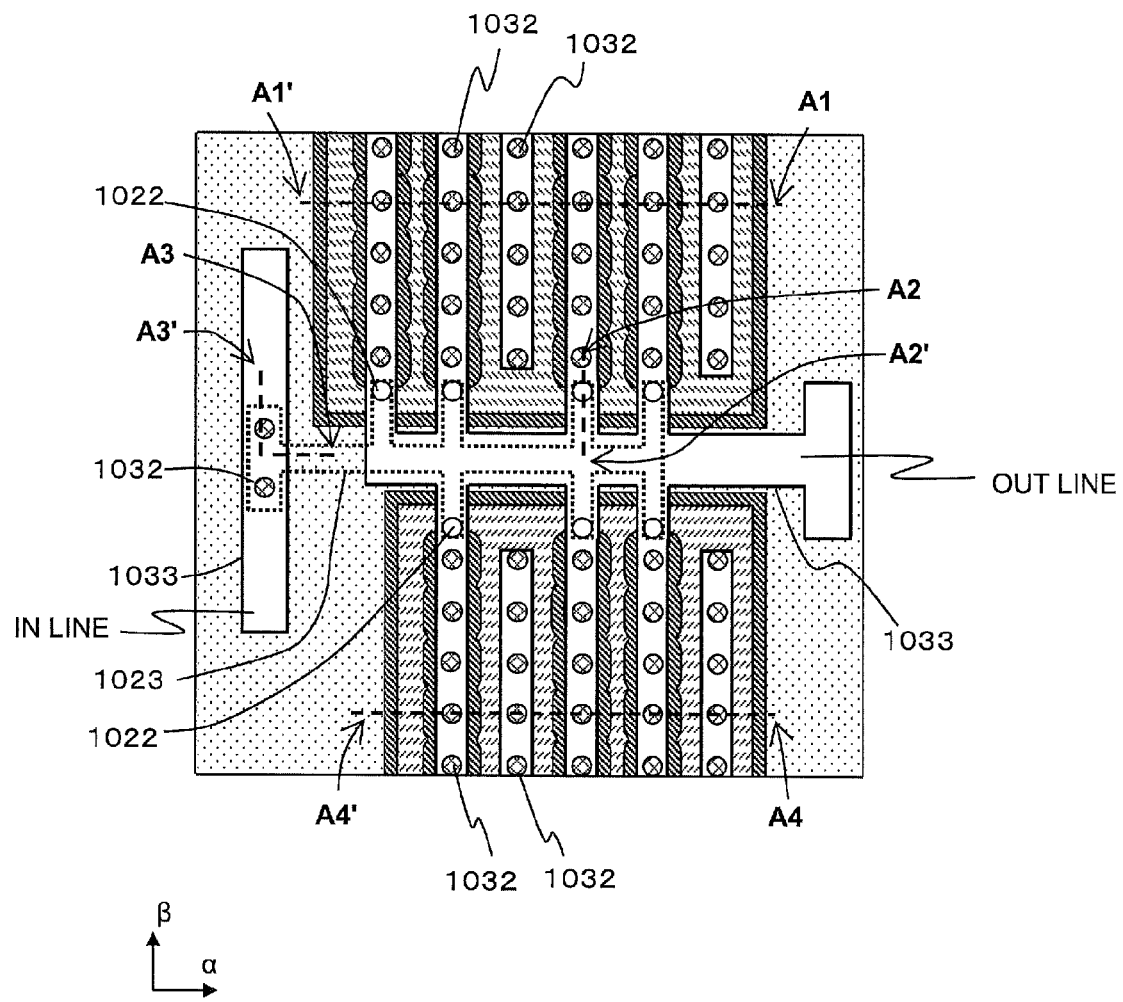

FIG. 10A is a plane view, showing a first contact, a first line, a second contact, and a second line, along with the pattern of pillar transistors shown in FIGS. 9A to 9D, in such a way that the above components overlap with each other. FIG. 10B is an enlarged plane view of an area around the center of what is shown in FIG. 10A.

Figure 10C:
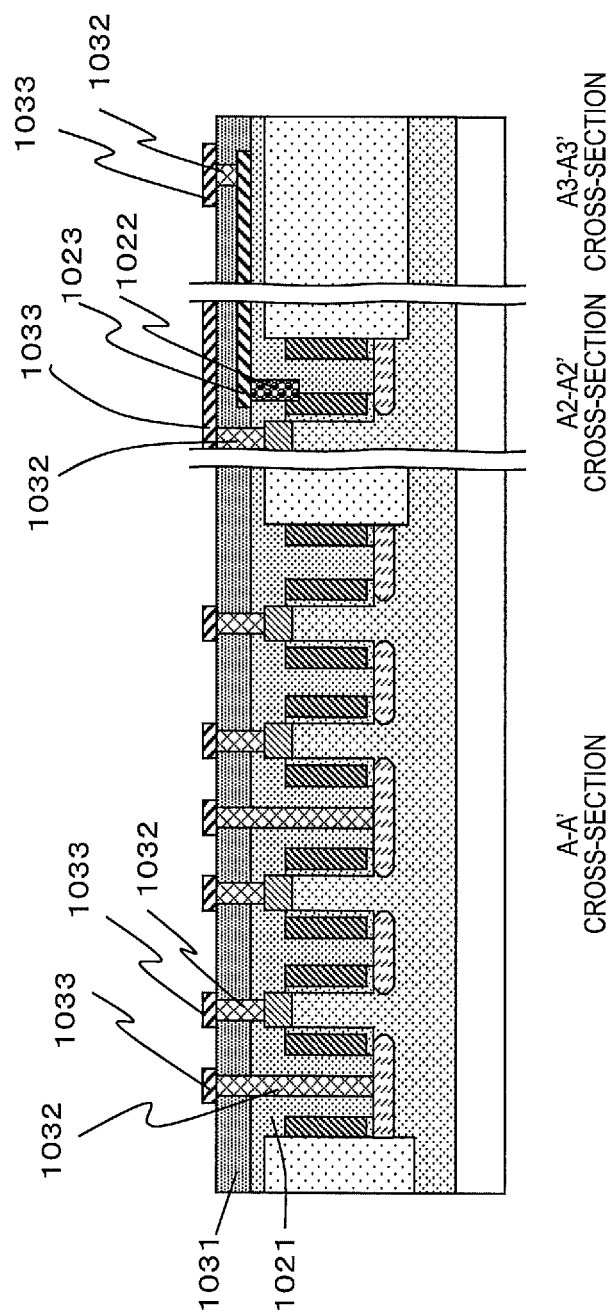
Figure 10D:
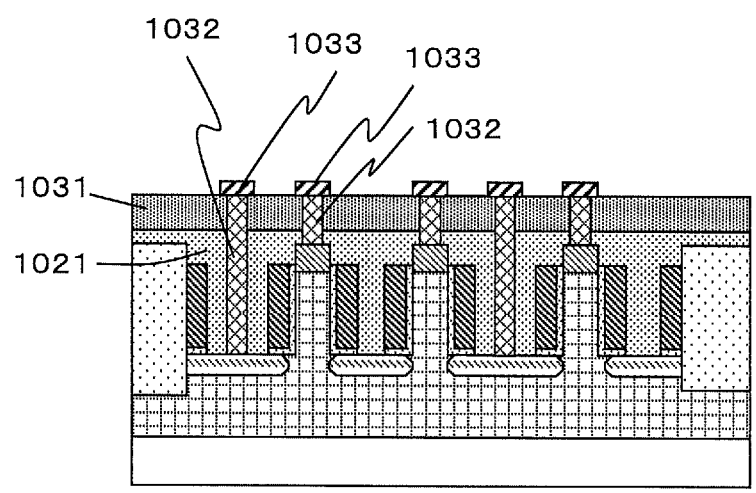

FIG. 10C is a cross-sectional view of FIG. 10A taken along lines A1-A1, A2-A2, and A3-A3. FIG. 10D is a cross-sectional view of FIG. 10A taken along line A4-A4.

The cross-sectional structure will be described with reference to FIGS. 10C and 10D.

On the pillar transistor shown in FIGS. 9A to 9D and the element isolation insulation film 921, a first interlayer film 1021 is so formed as to cover the pillar transistor and the element isolation insulation film 921.

On the first interlayer film 1021, a first contact 1022 is so formed as to pass through the first interlayer film 1021 and be connected to a gate electrode 933.

On the first interlayer film 1021, a first line 1023 is formed, and is connected to the first contact 1022.

On the first interlayer film 1021, and on the first line 1023, a second interlayer film 1031 is so formed as to cover the first interlayer film 1021 and the first line 1023.

On a second interlayer film 1031, the following are so formed as to pass through the second interlayer film 1031: the sources (sources 941 and 943), which are formed on the semiconductor substrate 911; the drains (drains 942 and 944), which are formed on the pillars 931; and second contacts 1032, which are connected to the first line 1023.

On the second interlayer film 1031, a second line 1033 is formed, and is connected to the second contacts 1032.

The following describes the planar structure with reference to FIGS. 10C and 10D.

The height direction of a cell row 1019 of a cell 1011 is referred to as β-direction; the direction perpendicular to the β-direction is referred to as α-direction.

In an β-direction upper area of the cell 1011, a pillar transistor P1 is disposed; in an β-direction lower area of the cell 1011, a pillar transistor N1 is disposed. The pillar transistors P1 and N1 are so disposed that the extending direction of the sub-pillar transistors of the pillar transistors P1 and N1 turns out to be the β-direction.

The pillar transistor P1 is disposed in such a way that the pattern shown in FIG. 9A is rotated 180 degrees. As for the X- and Y-directions in FIG. 9A, the X- and Y-directions need to be rotated 180 degrees, in the case of FIGS. 10A and 10B, to correspond to the α- and β-directions. Similarly, the pillar transistor N1 is disposed in such a way that the pattern shown in FIG. 9C is rotated 180 degrees. As for the X- and Y-directions in FIG. 9C, the X- and Y-directions need to be rotated 180 degrees, in the case of FIGS. 10A and 10B, to correspond to the α- and β-directions.

From top to bottom in the height direction of the cell row 1019 of the cell 1011, the areas are arranged in the following order: an upper power supply line area 1017, an upper line area 1014, a p-channel pillar transistor formation area 1012, a central line area 1015, a n-channel pillar transistor formation area 1013, a lower line area 1016, and a lower power supply line area 1018. In the p-channel pillar transistor formation area 1012, the pillar transistor P1 is formed; in the n-channel pillar transistor formation area 1013, the pillar transistor N1 is formed.

The arrangement of lines will be described.

In the upper power supply line area 1017, a VDD (first power supply) line, which is formed by the second line 1033 and extends laterally in the α-direction, is disposed.

In the lower power supply line area 1018, a VSS (second power supply) line, which is formed by the second line 1033 and extends laterally in the α-direction, is disposed.

In the central line area 1015, an OUT (output) line, which is formed by the second line 1033 and extends to the right side in the α-direction, is disposed.

In a left portion of the cell 1011, an IN (input) line, which is formed by the second line 1033 and extends in the β-direction, is disposed.

The gate electrodes 933 of the pillar transistors P1 and N1 are extended to the IN line.

In the pillar transistor P1, the first contact 1022 is disposed at the lower ends of the sub-pillar transistors SP1 to SP4. The first line 1023 is so disposed as to be connected to the first contact 1022. The first line 1023 is extended to the central line area 1015 and toward the light side in the α-direction, and is connected to the IN line through the second contacts 1032.

In the pillar transistor N1, the first contact 1022 is disposed at the upper ends of the sub-pillar transistors SN1 to SN3. The first line 1023 is so disposed as to be connected to the first contact 1022. The first line 1023 is extended to the central line area 1015 and toward the light side in the α-direction, and is connected to the IN line through the second contacts 1032. The first line 1023 is so formed as to be part of the first line 1023 extended from the pillar transistor P1.

The source of the pillar transistor P1 is extended to the VDD line.

In the pillar transistor P1, a plurality of second contacts 1032, which are connected to the sources 941, are arranged side by side in the β-direction, thereby forming an array that extends in the β-direction. The second lines 1033, which connect to the second contacts 1032 and extend in the β-direction, are disposed. The second lines 1033 cross over the upper line area 1014 before being extended into the upper power supply line area 1017, and are connected to the VDD line.

The source of the pillar transistor N1 is extended to the VSS line.

In the pillar transistor N1, a plurality of second contacts 1032, which are connected to the sources 943, are arranged side by side in the β-direction, thereby forming an array that extends in the β-direction. The second lines 1033, which connect to the second contacts 1032 and extend in the β-direction, are disposed. The second lines 1033 cross over the lower line area 1016 before being extended into the lower power supply line area 1018, and are connected to the VSS line.

The drains of the pillar transistors P1 and N1 are extended to the OUT line.

In the pillar transistor P1, the second contacts 1032 are formed on the drains 942 of the pillars 931 that make up the sub-pillar transistors SP1 to SP4, thereby forming an array of second contacts 1032 that are arranged in the β-direction. The second lines 1033, which extend in the β-direction on the arrays of second contacts 1032, are formed. The second lines 1033 are extended into the central line area 1015, and are connected to the OUT line.

In the pillar transistor N1, the second contacts 1032 are formed on the drains 944 of the pillars 931 that make up the sub-pillar transistors SN1 to SNN, thereby forming an array of second contacts 1032 that are arranged in the β-direction. The second lines 1033, which extend in the β-direction on the arrays of second contacts 1032, are formed. The second lines 1033 are extended into the central line area 1015, and are connected to the OUT line. The OUT line is so formed as to be part of the OUT line extended from the pillar transistor P1.

In that manner, the cell 1011 of the NOT circuit shown in FIG. 4A is formed.

FIGS. 5A to 5C are diagrams showing a layout of a two-input NOT-AND circuit (NAND circuit) that uses pillar transistors, which is created by the layout data creation device of the present embodiment. FIG. 5B shows the result of pillar-transistor division of a NAND circuit that is made up of p-channel transistors P2 and P3 and n-channel transistors N2 and N3 in a netlist shown in FIG. 5A.

In this case, in the NAND circuit shown in FIG. 5A, the number P of unit pillar transistors of the p-channel transistors P2 and P3 is 22; the cell row height R_max is 11. In the NAND circuit shown in FIG. 5A, the number P of unit pillar transistors of the n-channel transistors N2 and N3 is 16; the cell row height R_max is 8.

In the process of the flowchart shown in FIG. 3, the transistor adjustment unit 2 sets the division information of the p-channel pillar transistors P2 and P3 in the following manner as shown in FIG. 5B: Tr=(R:11, Lx:2, #1(11), #2(11)).

Similarly, as shown in FIG. 5B, in the process of the flowchart shown in FIG. 3, the transistor adjustment unit 2 sets the division information of the n-channel pillar transistors N2 and N3 in the following manner: Tr=(R:8, Lx:2, #1(8), #2(8)).

The sub-pillar transistors SP1 (#1) and SP2, which are obtained by dividing the pillar transistor P2, have the same number of unit pillar transistors that make up the sub-pillar transistors. Similarly, the sub-pillar transistors SP3 (#1) and SP4, which are obtained by dividing the pillar transistor P3, have the same number of unit pillar transistors that make up the sub-pillar transistors. The sub-pillar transistors SN1 (#1) and SN2 (#2), which are obtained by dividing the pillar transistor N2, have the same number of unit pillar transistors that make up the sub-pillar transistors. Similarly, the sub-pillar transistors SN3 (#1) and SN4 (#2), which are obtained by dividing the pillar transistor N3, have the same number of unit pillar transistors that make up the sub-pillar transistors.

FIG. 5C shows the arrangements of pillar transistors P1 and P2 and pillar transistors N2 and N3 in a cell row.

The cell row includes a p-channel pillar transistor formation area, where a p-channel pillar transistor is formed; a n-channel pillar transistor formation area; a power supply line area; and a line area for transistors in the cell.

As indicated by the above-described division information, as for the p-channel pillar transistors P2 and P3 and the n-channel pillar transistors N2 and N3, the pillar missing number is zero. Therefore, the transistors each are disposed in the pillar transistor area without changing the height of the cell.

The following describes a specific example of a device structure of the two-input NOT-AND circuit (NAND circuit) shown in FIGS. 5A to 5C.

FIGS. 11A to 11E are diagrams showing a device structure of the pillar transistors P2, P3, N2, and N3 shown in FIG. 5B. The diagram shows the stage at which the transistors have been formed. The basic configurations of the above are formed with the use of the same configurations as those shown in FIGS. 9A to 9D. Moreover, the same elements as those in FIGS. 9A to 9D are represented by the same reference symbols.

FIG. 11A is a top view of the pillar transistor P2 shown in FIG. 5B. FIG. 11B is a cross-sectional view of FIG. 11A taken along line A-A.

FIG. 11B is a top view of the pillar transistor P3 shown in FIG. 5B.

Figure 11C:
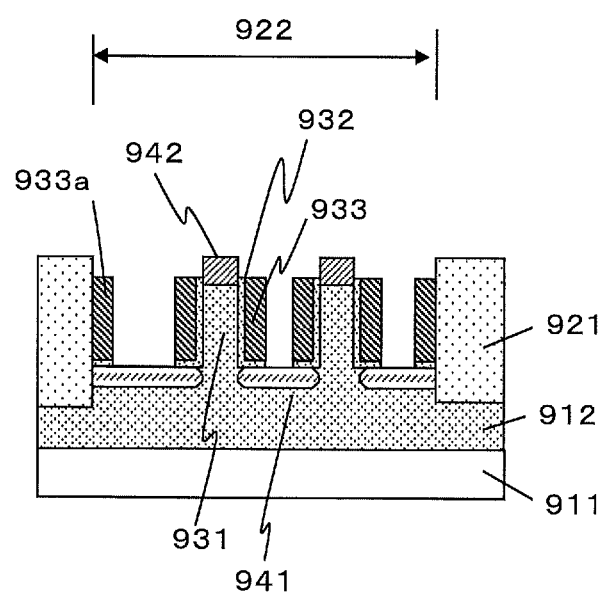
Figure 11D:
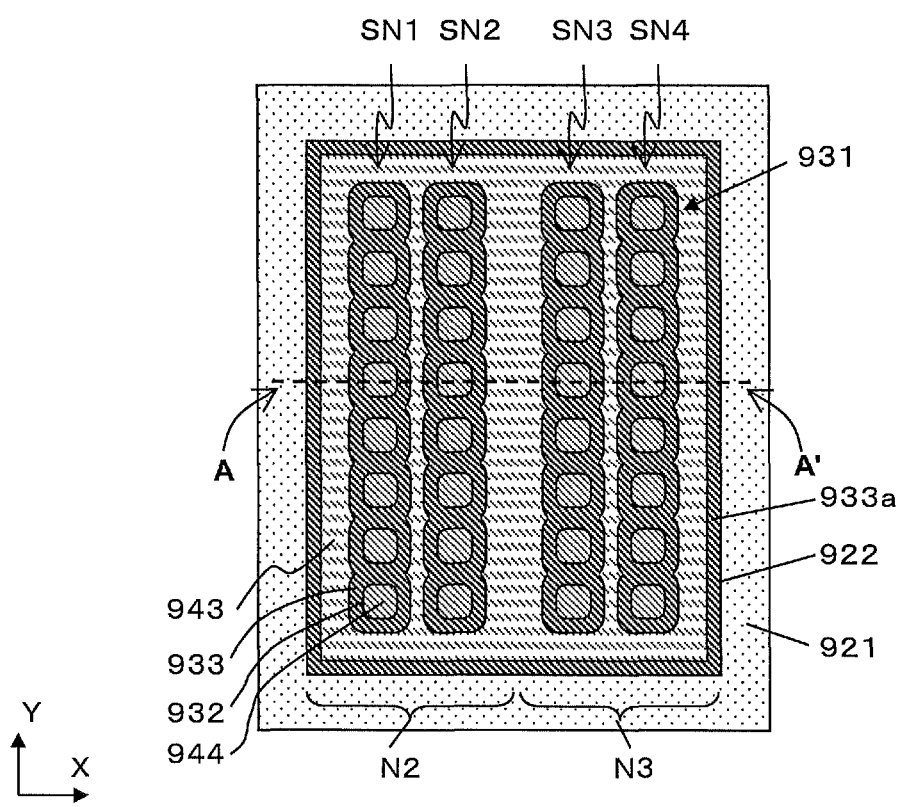
Figure 11E:
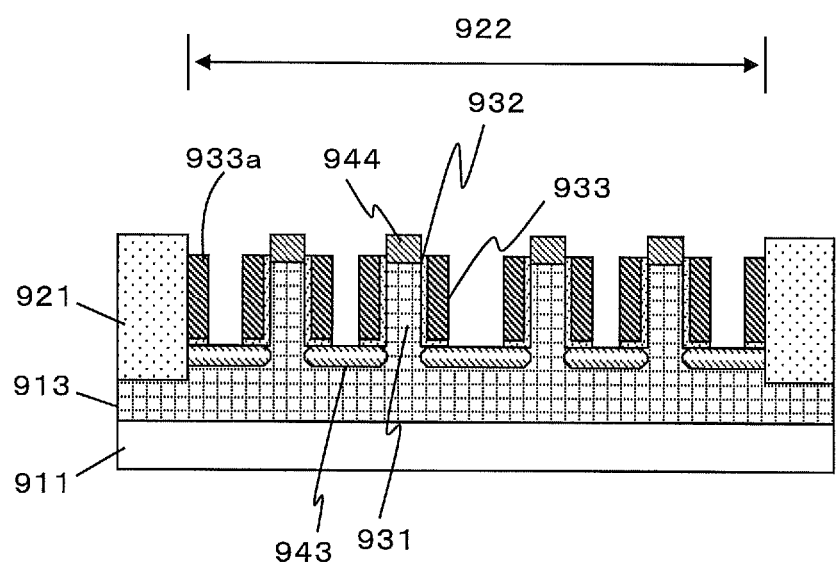

FIG. 11D is a top view of the pillar transistors N2 and N3 shown in FIG. 5B. FIG. 11E is a cross-sectional view of FIG. 11D taken along line A-A.

As shown in FIGS. 11A, 11B, and 11D, on the plane, the extending direction of sub-pillar transistors that make up a pillar transistor is referred to as Y-direction; the direction perpendicular to the Y-direction is referred to as X-direction.

First, the P-channel pillar transistor P1 shown in FIGS. 11A and 11C will be described.

In a surface area of a semiconductor substrate 911, a N-type N-well 912 is formed.

In a surface portion of the semiconductor substrate 911, an element isolation insulation film 921 is formed. When seen on the plane, an element formation area 922 is defined by the element isolation insulation film 921.

In the element formation area 922, pillars 931, which are made of a semiconductor material, are formed. The bottoms of the pillars 931 are connected to the N-well 912 of the semiconductor substrate 911. Bodies of the pillars 931, which make up the pillar transistor P1, are doped with N-type impurities.

On the side surfaces of the pillars 931, as well as on the side surfaces of the element isolation insulation film 921, gate electrodes 933 are formed, with gate insulation films 932 disposed therebetween. On the side walls of the element isolation insulation film 921, gate electrode blocks 933*a* are formed.

On the semiconductor substrate 911 on the lower sides of the pillars 931, and in upper areas of the pillars 931, source/drain regions are formed. For ease of explanation, among the two types of region, i.e. source and drain, the regions formed on the semiconductor substrate 911 are referred to as sources 941, and the regions formed in the upper areas of the pillars 931 are referred to as drains 942. In the P-channel pillar transistor P1, the sources 941 and the drains 942 are made from P-type diffusion layers.

The pillars 931 serve as bodies; the drains 942 and the sources 941 are formed on the upper and lower sides of the pillars 931; and the gate electrodes 933 are formed on the side walls. In this manner, pillar transistors are formed.

When seen on the plane, pillars 931 are so formed as to be arranged side by side in the Y-direction, forming the sub-pillar transistors SP. In the example shown in FIG. 11A, 11 pillars 931 arranged in the Y-direction make up a P-channel sub-pillar transistor SP. The gate electrodes 933 are so formed as to encircle the pillars 931. The gate electrodes 933 are so formed as to be connected together between the pillars 931 that are adjacent to each other in the Y-direction. As a result, a series of gate electrodes that are connected in the Y-direction is formed as if a line is disposed.

Two lines of the sub-pillar transistors SP are formed in the X-direction when seen on the plane. From left to right, the sub-pillar transistors SP are referred to as SP1 and SP2, respectively. When seen on the plane, an area on the left side of SP1 and an area between SP2 and SP3 are the areas where source contacts are disposed. The areas are secured so that the gate electrodes 933 and the contacts are not short-circuited.

FIG. 11B is a top view of the pillar transistor P3. The pillar transistor P3 has the same structure as the pillar transistor P2. Two lines of sup-pillar transistors SP are formed in the X-direction when seen on the plane. From left to right, the sup-pillar transistors SP are referred to as SP3 and SP4, respectively.

The following describes the N-channel pillar transistors N2 and N3 shown in FIGS. 11D and 11E.

The pillar transistors N2 and N3 are arranged side by side in the X-direction in one element formation area 922. The pillar transistor N2 is disposed in the X-direction left area, and the pillar transistor N3 in the right area.

A well in which the pillar transistors N2 and N3 are formed is formed in a P-type P-well 913. Bodies of pillars 931 are doped with P-type impurities. A source 943 and drains 944 are made from N-type diffusion layers. The source 943 is shared by the pillar transistors N2 and N3.

The pillar transistor N2 is formed in such a way that two lines of n-channel sub-pillar transistors SN, each of which is made up of eight pillars 931 arranged in the Y-direction, are arranged in the X-direction. From left to right, the sub-pillar transistors SN are referred to as SN1 and SN2, respectively.

Similarly, the pillar transistor N3 is formed in such a way that two lines of n-channel sub-pillar transistors SN, each of which is made up of eight pillars 931 arranged in the Y-direction, are arranged in the X-direction. From left to right, the sub-pillar transistors SN are referred to as SN3 and SN4, respectively.

Figure 12:
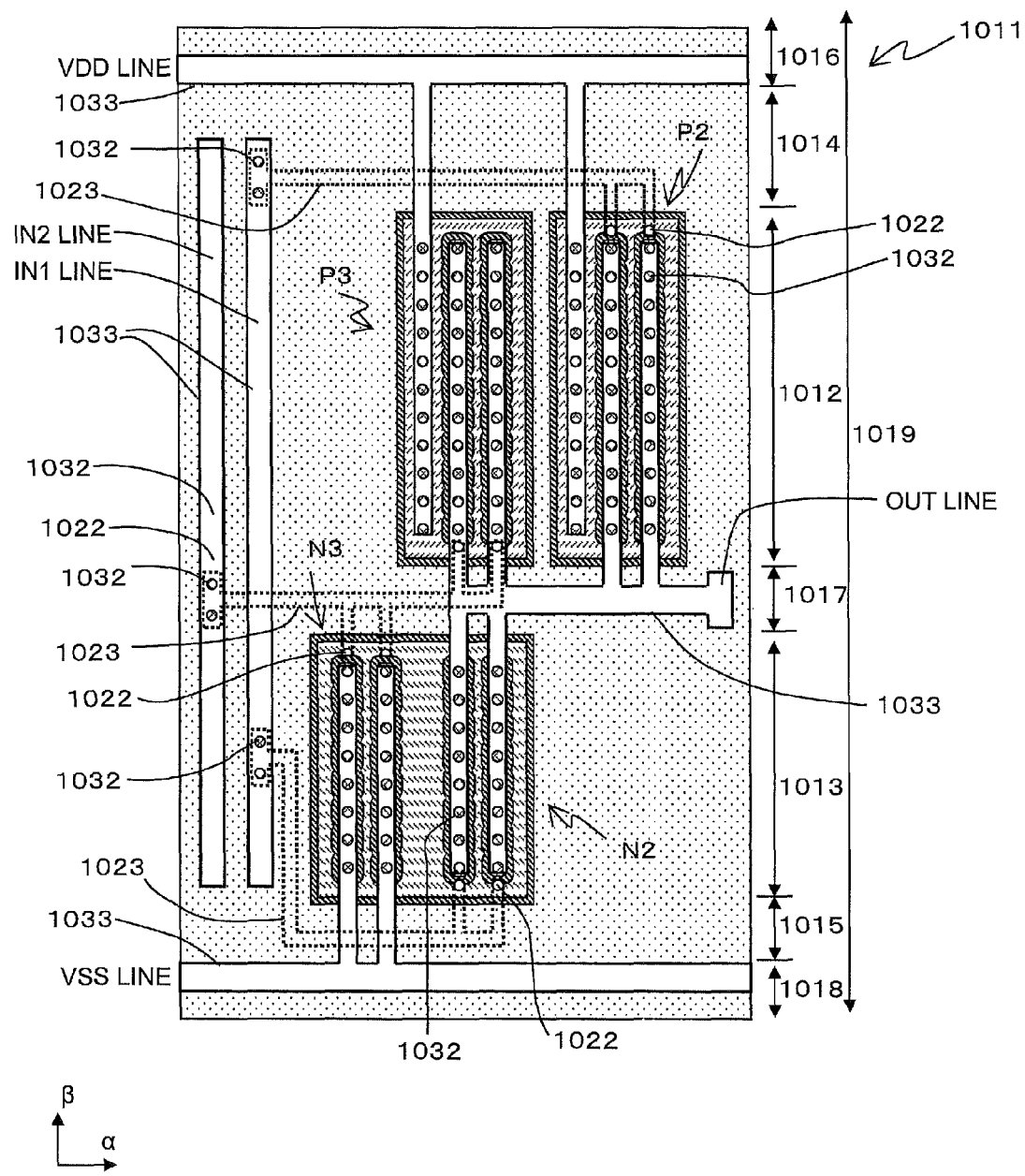
FIG. 12 is a diagram showing a device structure of a cell of the two-input NOT-AND circuit (NAND circuit) shown in FIG. 5C.

FIG. 12 is a diagram showing a device structure of a cell of the two-input NOT-AND circuit (NAND circuit) shown in FIG. 5C. The basic configurations of components in the above are formed with the use of the same configurations as those shown in FIGS. 10A to 10D. Moreover, the same elements as those in FIGS. 10A to 10D are represented by the same reference symbols.

FIG. 12 shows the structure in which interlayer films, contacts, and lines are formed after the pillar transistors shown in FIGS. 11A to 11E are formed. FIG. 12 is a plane view, showing a first contact, a first line, a second contact, and a second line, along with the pattern of pillar transistors shown in FIGS. 9A to 9D, in such a way that the above components overlap with each other.

The cross-sectional structure will be described. The structure used is the same as that in FIGS. 10A to 10D.

On the pillar transistor shown in FIGS. 10A to 10D and the element isolation insulation film 921, a first interlayer film 1021 is so formed as to cover the pillar transistor and the element isolation insulation film 921.

On the first interlayer film 1021, a first contact 1022 is so formed as to pass through the first interlayer film 1021 and be connected to a gate electrode 933.

On the first interlayer film 1021, a first line 1023 is formed, and is connected to the first contact 1022.

On the first interlayer film 1021, and on the first line 1023, a second interlayer film 1031 is so formed as to cover the first interlayer film 1021 and the first line 1023.

On a second interlayer film 1031, the following are so formed as to pass through the second interlayer film 1031: the sources (sources 941 and 943), which are formed on the semiconductor substrate 911; the drains (drains 942 and 944), which are formed on the pillars 931; and second contacts 1032, which are connected to the first line 1023.

On the second interlayer film 1031, a second line 1033 is formed, and is connected to the second contacts 1032.

The following describes the planar structure with reference to FIG. 12.

The height direction of a cell row of a cell 1011 is referred to as β-direction; the direction perpendicular to the β-direction is referred to as α-direction. The pillar transistors that are to be disposed are so disposed that the sub-pillar transistors of the pillar transistors extend in the β-direction.

The pillar transistors P2 and P3 are arranged side by side in the α-direction; from left to right, the pillar transistors P3 and P2 are disposed in that order. The pillar transistors P2 and P3 are disposed in an β-direction upper area.

Elements of the pillar transistors N2 and N3 are disposed in such a way that the pattern shown in FIG. 11A is rotated 180 degrees. As for the X- and Y-directions in FIG. 11A, the X- and Y-directions need to be rotated 180 degrees to correspond to the α- and β-directions in FIG. 12. The pillar transistors N2 and N3 are disposed in a β-direction lower area.

From top to bottom in the height direction of the cell row 1019 of the cell 1011, the areas are arranged in the following order: an upper power supply line area 1017, an upper line area 1014, a p-channel pillar transistor formation area 1012, a central line area 1015, a n-channel pillar transistor formation area 1013, a lower line area 1016, and a lower power supply line area 1018. In the p-channel pillar transistor formation area 1012, the pillar transistors P2 and P3 are formed; in the n-channel pillar transistor formation area 1013, the pillar transistors N2 and N3 are formed.

The arrangement of lines will be described.

In the upper power supply line area 1017, a VDD (first power supply) line, which is formed by the second line 1033 and extends laterally in the α-direction, is disposed.

In the lower power supply line area 1018, a VSS (second power supply) line, which is formed by the second line 1033 and extends laterally in the α-direction, is disposed.

In the central line area 1015, an OUT (output) line, which is formed by the second line 1033 and extends to the right side in the α-direction, is disposed.

In a left portion of the cell 1011, an IN1 (input 1) line and an IN2 (input) line, which are formed by the second line 1033 and extend in the β-direction, are disposed side by side.

The gate electrodes 933 of the pillar transistors P2, P3, N2, and N3 are extended to the IN1 or IN2 line.

In the pillar transistor P2, the first contact 1022 is disposed at the β-direction upper end. The first line 1023 is so disposed as to be connected to the first contact 1022. The first line 1023 is extended into the upper line area 1014 and toward the light side in the α-direction, and is connected to the IN1 line through the second contacts 1032.

In the pillar transistor P3, the first contact 1022 is disposed at the β-direction lower end. The first line 1023 is so disposed as to be connected to the first contact 1022. The first line 1023 is extended into the central line area 1015 and toward the light side in the α-direction, and is connected to the IN2 line through the second contacts 1032.

In the pillar transistor N2, the first contact 1022 is disposed at the β-direction lower end. The first line 1023 is so disposed as to be connected to the first contact 1022. The first line 1023 is extended into the lower line area 1016 and toward the light side in the α-direction, and is connected to the IN1 line through the second contacts 1032.

In the pillar transistor N3, the first contact 1022 is disposed at the β-direction upper end. The first line 1023 is so disposed as to be connected to the first contact 1022. The first line 1023 is extended into the central line area 1015 and toward the light side in the α-direction, and is connected to the IN2 line through the second contacts 1032. The first line 1023 is so formed as to be part of the first line 1023 extended from the pillar transistor P3.

The source of the pillar transistor P2 is extended to the VDD line.

In the pillar transistor P2, a plurality of second contacts 1032, which are connected to the sources 941, are arranged side by side in the β-direction, thereby forming an array that extends in the β-direction. The second line 1033, which connects to the second contacts 1032 and extends in the β-direction, is disposed. The second line 1033 is extended into the upper power supply line area 1017, and is connected the VDD line. Similarly, in the pillar transistor P3, the sources are connected to the VDD line via the second contacts 1032 and the second line 1033.

Incidentally, in the pillar transistors N2 and N3, there are no contacts that are connected to the sources. Incidentally, the sources of the pillar transistors N2 and N3 are so formed as to be short-circuited.

The drains of the pillar transistors P2, P3, and N2 are extended to the OUT line.

In the pillar transistor P2, the second contacts 1032 are formed on the drains 942 of the pillars 931 that make up the sub-pillar transistors SP1 and SP2, thereby forming an array of second contacts 1032 that are arranged in the β-direction. The second lines 1033, which extend in the β-direction so as to connect to the second contacts 1032, are disposed. The second lines 1033 are extended into the central line area 1015, and are connected to the OUT line.

Similarly, in the pillar transistor P3, the second contacts 1032 are formed on the drains 942 of the pillars 931 that make up the sub-pillar transistors SP3 and SP4, thereby forming an array of second contacts 1032 that are arranged in the β-direction. The second lines 1033, which extend in the β-direction so as to connect to the second contacts 1032, are disposed. The second lines 1033 are extended into the central line area 1015, and are connected to the OUT line.

In the pillar transistor N2, the second contacts 1032 are formed on the drains 944 of the pillars 931 that make up the sub-pillar transistors SN1 and SN2, thereby forming an array of second contacts 1032 that are arranged in the β-direction. The second lines 1033, which extend in the β-direction so as to connect to the second contacts 1032, are disposed. The second lines 1033 are extended into the central line area 1015, and are connected to the OUT line.

The drains of the pillar transistor N3 are extended to the VSS line.

In the pillar transistor N3, the second contacts 1032 are formed on the drains 944 of the pillars 931 that make up the sub-pillar transistors SN3 and SN4, thereby forming an array of second contacts 1032 that are arranged in the β-direction. The second lines 1033, which extend in the β-direction so as to connect to the second contacts 1032, are disposed. The second lines 1033 are extended into the lower line area 1018, and are connected to the VSS line.

In that manner, the cell 1011 of the NAND circuit shown in FIG. 5A is formed.

As another example, suppose that the cell row height R_max is 300, and the number P of pillars of a pillar transistor is 1,000. In this case, the division number Lx, by which the pillar transistor is divided into sub-pixels, is four; the pillar missing number Lp is 200.

As a result, the cell height is as follows: R=300−ROUND-DOWN(200/4,0)=250. Moreover, as for a sub-pillar transistor, the number of lines of unit pillar transistors is four (division number Lx). Each sub-pillar transistor has a pillar-transistor structure in which the number of unit pillar transistors is 250 (cell height R), i.e. Tr=(R:250, Lx:4, #1(250), #2 (250), #2(250), #4 (250)). Therefore, if one unit pillar transistor is regarded as a configurational unit, the area is as follows: 4×250=1,000. As a result, the minimized area is obtained.

Meanwhile, when the pillar missing number occurs, the transistor structure is as follows: Tr=(R:300, Lx:4, #1(300), #2 (300), #2(300), #4 (100)). In this case, if one unit pillar transistor is regarded as a configurational unit, the area is as follows: 4×300=1,200. Therefore, what is needed is the area where 1,200 unit pillar transistors can be disposed.

Thus, compared with the case where an equalization process, i.e. an equalization process performed by the equation (3) at a time when the pillar missing number Lp occurs, is not performed, or compared with the case where a process of equalizing the number of unit pillar transistors of a sup-pillar transistor, which is obtained by dividing a pillar transistor, in each line is not performed, the area can be reduced substantially.

As described above, according to the present embodiment, the size of pillar transistors that make up a cell is converted into the length of a conventional gate width. The unit pillar transistors are so designed that the number of unit pillar transistors is an integer. With respect to the height of a cell row that is so set as to be an integer multiple of the unit pillar transistors, the pillar transistor is so divided as to offer the sub-pillar transistors where the number of unit pillar transistors that can be disposed is an integer.

Therefore, according to the present embodiment, unlike the conventional cases, the number of pillar division units does not become a number with a decimal point. Moreover, there is no need to change the size of unit pillar transistors. Furthermore, without making the process of manufacturing the semiconductor device complex, it is possible to dispose cells into a cell row in an efficient manner by using transistors of a pillar type.

Moreover, according to the present embodiment, the sub-pillar transistors that are obtained by the division each have substantially the same number of pillars, which make up the sub-pillar transistors that are obtained by the division. Therefore, the area of a cell that is made up of pillar transistors can be reduced.

According to the present invention, what is provided is the transistor adjustment unit 2 that divides a pillar-type transistor (pillar transistor), which is made up of a plurality of unit pillar transistors (unit pillar-type transistors) in an integrated circuit, into unit pillar-type transistors in such a way that the unit pillar-type transistors can be disposed in a placement area of the pillar-type transistor in the integrated circuit and the number of the unit pillar-type transistors is an integer, thereby generating sub-pillar-type transistors, which are disposed in the placement area.

Therefore, according to the present invention, the size of pillar transistors that make up a circuit (cell) of a semiconductor device is converted into the length of a conventional gate width. The unit pillar transistors are so designed that the number of unit pillar transistors is an integer. With respect to the height of a cell row that is so set as to be an integer multiple of the unit pillar transistors, the pillar transistor is divided, and the number of unit pillar transistors that can be disposed in the cell row is an integer.

Figure 6:
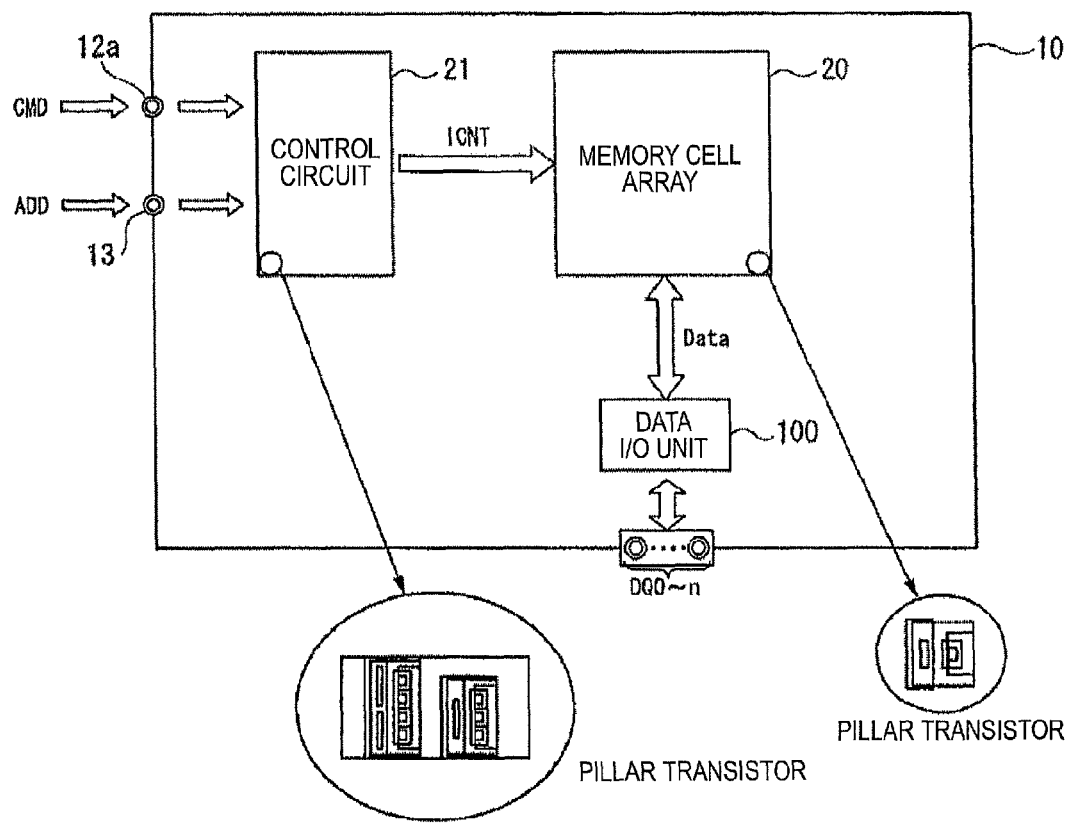
FIG. 6 schematically shows the configuration of a semiconductor device.
Figure 7A:
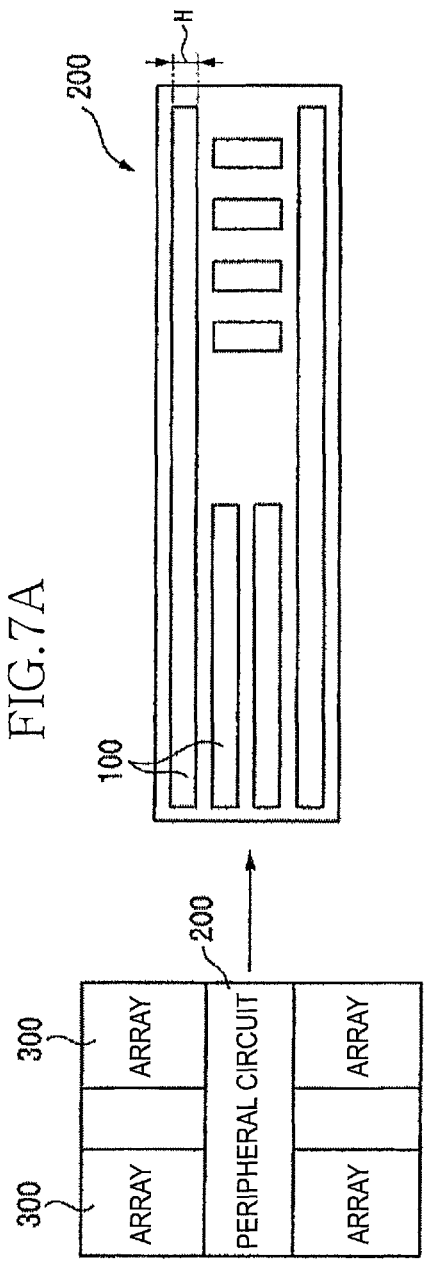
FIGS. 7A and 7B are the configuration of a semiconductor device at a time when the present invention is applied to a semiconductor device.
Figure 7B:
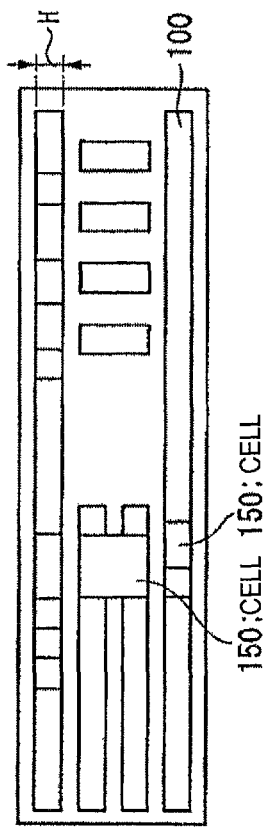
Figure 8A:
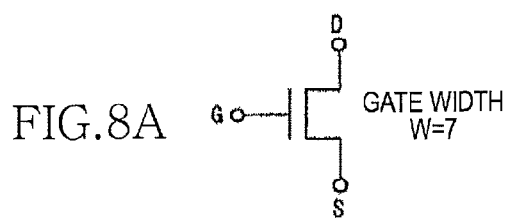
FIGS. 8A and 8B are schematic diagram showing a MOS transistor divided when the gate width of the MOS transistor of a cell is 7 μm.
Figure 8B:
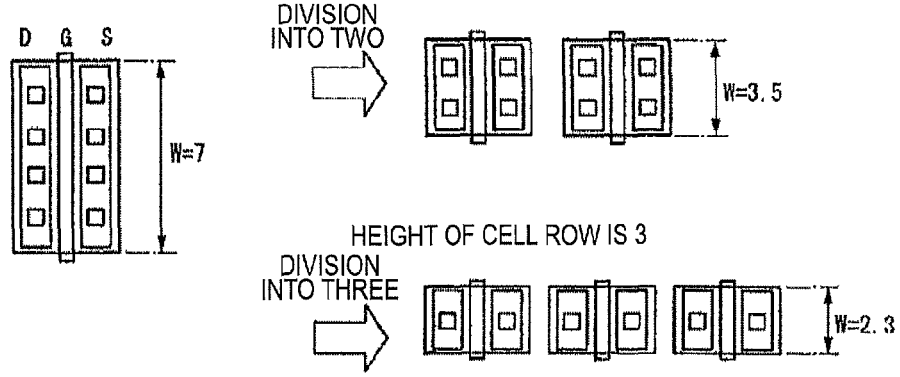

FIG. 6 schematically shows the configuration of a semiconductor device 10 at a time when the present invention is applied to a semiconductor device, which is for example a SDRAM (Synchronous Dynamic Random Access Memory) that operates in synchronization with a clock signal supplied from outside. Incidentally, all the circuit blocks shown in FIG. 6 are formed on the same semiconductor chip made of single crystal silicon. For example, the circuit blocks each are made up of a plurality of transistors, such as PMOS pillar-type transistors (pillar-type P-channel MOS transistors) and NMOS pillar-type transistors (pillar-type N-channel MOS transistors). Those indicated by symbol ○ (circle) are pads that serve as external terminals provided on the semiconductor chip.

The semiconductor device 10 is so formed as to include a memory cell array 20 and a data input/output unit 100. In this case, transistors of a control circuit 21 and the data input/output unit 100 are pillar transistors (i.e. sub-pillar transistors), which are made up of a plurality of unit pillar-type transistors of the present embodiment.

The semiconductor device 10 includes the following as external terminals (or pads on the semiconductor chip): command terminals 12a, address terminals 13, and data terminals DQ0 to DQn. The semiconductor device 10 also includes other external terminals, such as clock terminals and power supply terminals; the other external terminals, however, are not shown in the diagram because the other external terminals are unrelated to the present invention.

The command terminals 12a collectively represent terminals to which a row address strobe signal /RAS, a column address strobe signal /CAS, a write enable signal /WE, a chip select signal /CS, and any other signal are supplied, for example. A combination of signals input into the above terminals makes up a command signal CMD. The command terminals 12a are connected to the control circuit 21.

The address terminals 13 are terminals to which address signals ADD are supplied, and are connected to the control circuit 21. The data terminals DQ are terminals for outputting read data and inputting write data, and are connected to the data input/output unit 100.

The memory cell array 20 includes a plurality of word lines, a plurality of bit lines, and a plurality of memory cells; the memory cells are disposed at the intersections of the word and bit lines. As in the case of a peripheral circuit, the transistors that make up the memory cells are pillar-type MOS transistors, as shown in the diagram.

The control circuit 21 supplies various operation control signals ICNT, which are used to control an operation of the memory cell array 20, to the memory cell array 20 in accordance with a command signal CMD supplied from outside via the command terminals 12a, and address signals ADD supplied from outside via the address terminals 13.

By supplying various operation control signals ICNT to the memory cell array 20, the control circuit 21 controls a read operation and a write operation: the read operation is an operation of reading data from memory cells in the memory cell array 20; and the write operation is an operation of writing data to memory cells.

If a mode register set command (MRS command) is supplied from outside via the command terminals 12a as a command signal CMD, the control circuit 21 controls the process of writing data into memory cells in the memory cell array 20 and the process of reading data from the memory cells in accordance with a mode register set signal MRS, which corresponds to a mode setting code supplied as address signals ADD from the address terminals 13 along with the above MRS command.

During a read operation, the data input/output unit 100 supplies data Data supplied from the memory cell array 20 to the outside via the data terminals DQ0 to DQn. During the write operation, the data input/output unit 100 supplies data Data supplied from the outside via the data terminals DQ0 to DQn to the memory cell array 20.

According to the present invention, a pillar-type transistor that is made up of a plurality of unit pillar-type transistors is divided into sub-pillar-type transistors made up of the unit pillar-type transistors which can be disposed in a placement area and the number of which is an integer. The sources, drains, and gates of the sub-pillar-type transistors are connected in common, forming an internal circuit.

Therefore, according to the present invention, unlike the conventional cases, the number of pillar division units contains no fractions after the decimal point. Therefore, there is no need to change the size of unit pillar transistors. Furthermore, without making the process of manufacturing the semiconductor device complex, it is possible to dispose cells into a cell row in an efficient manner by using transistors of a pillar type.

The pillar-transistor division process at a time when a pillar transistor is disposed in a cell may be performed by recording a program, which is required to realize the functions of the layout data creation device shown in FIG. 1, onto a computer-readable recording medium, loading the program recorded on the recording medium into a computer system, and executing the program. Incidentally, the "computer system" includes OS and hardware such as peripheral devices.

The "computer system" includes a homepage provision environment (or a display environment) if a WWW system is used.

The "computer-readable recording medium" means a portable medium, such as a flexible disk, magnetic optical disk, ROM, or CD-ROM, or a storage device, such as a built-in hard disk of a computer system. Moreover, the "computer-readable recording media" include those for retaining the program dynamically for a short period of time, including a communication line that is used to transmit the program via a communication channel such as a network like the Internet or a telephone line; and those for retaining the program for a certain period of time, including a volatile memory inside a computer system that works as a server or client at that time. The above program may only realize some of the above-described functions. Moreover, to offer the above-described functions, the program may work together with a program that is already recorded in the computer system.

The above has described in detail the embodiment of the invention with reference to the drawings. However, the specific configuration thereof is not limited to the above embodiment, and also includes the designs and other factors that are within the scope of the present invention.

What is claimed is:
1. A semiconductor device comprising:
a pillar-type transistor including:
a plurality of sub-pillar-type transistors arranged in a predetermined area, each of the sub-pillar-type transistors including one or more unit pillar-type transistors arranged in line to a first direction in the predetermined area, each of the sub-pillar-type transistors including a source, a drain and a gate, the sources of the sub-pillar-type transistors being connected in common, the drains of the sub-pillar-type transistors being connected in common, and the gates of the sub-pillar-type transistors being connected in common; and gate electrode blocks surrounding the plurality of sub-pillar-type transistors.

2. The semiconductor device as claimed in claim 1, wherein one of the sub-pillar-type transistor and another one of the sub-pillar-type transistor include a different number of the unit pillar-type transistors.

3. The semiconductor device as claimed in claim 1, wherein the pillar-type transistor further comprises:

an element isolation film surrounding the plurality of the plurality of sub-pillar-type transistors.

4. The semiconductor device as claimed in claim 3, wherein the gate electrode blocks are formed on a side wall of the element isolation film.

5. The semiconductor device as claimed in claim 4, further comprising a second pillar-type transistor, wherein the element isolation film electrically isolates the pillar-type transistor from the second pillar-type transistor.

6. The semiconductor device as claimed in claim 1, wherein each one of the plurality of sub-pillar-type transistors includes one or more unit pillar-type transistors having a same configuration as one another, the sub-pillar-type transistors in the predetermined area being arranged in an integrated circuit.

7. The semiconductor device as claimed in claim 1, wherein:

the one or more of the unit pillar-type transistors constituting the pillar-type transistor are arranged by an allocatable number with rounding up to calculate a division number, where the allocatable number represents a number of the unit pillar transistors that can be arranged in a first direction of the predetermined area, the allocatable number being an integer greater than zero, and the pillar-type transistor is divided into the plurality of sub-pillar-type transistors in the division number.

8. The semiconductor device as claimed in claim 1, wherein a division of the pillar-type transistor is adjustable by a transistor adjustment unit into the plurality of sub-pillar-type transistors in the predetermined area without changing diameters of the unit pillar transistors.

9. A pillar-type transistor comprising:

a semiconductor substrate;

a plurality of pillars comprising a semiconductor material having a first conductivity type, the plurality of pillars project in a direction perpendicular to the semiconductor substrate in a predetermined element formation area;

gate electrodes being formed around side surfaces of each of the plurality of pillars;

source and drain regions being formed on the semiconductor substrate on lower sides of the pillars and in upper areas of the pillars;

a plurality of sub-pillar-type transistors grouped in a predetermined area, each of the sub-pillar-type transistors including one or more unit pillar-type transistors arranged in line to a first direction in the predetermined area, each of the sub-pillar-type transistors including the source region, the drain region and the gate electrodes, the source regions of each of the sub-pillar-type transistors being connected in common, the drain regions of each of the sub-pillar-type transistors being connected in common, and the gate electrodes of each of the sub-pillar-type transistors being connected in common; and a gate block surrounding the plurality of sub-pillar-type transistors.

10. The pillar-type transistor as claimed in claim 9, wherein one of the sub-pillar-type transistor and another one of the sub-pillar-type transistor include a different number of the unit pillar-type transistors.

11. The pillar-type transistor as claimed in claim 9, further comprising an element isolation film surrounding the plurality of sub-pillar-type transistors.

12. The pillar-type transistor as claimed in claim 11, wherein the gate electrode blocks are formed on a side wall of the element isolation film.

* * * * *